(12) United States Patent
Kouno et al.

(10) Patent No.: US 8,648,385 B2
(45) Date of Patent: Feb. 11, 2014

(54) SEMICONDUCTOR DEVICE

(75) Inventors: Kenji Kouno, Gifu (JP); Hiromitsu Tanabe, Nukata-gun (JP); Yukio Tsuzuki, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 136 days.

(21) Appl. No.: 13/301,973

(22) Filed: Nov. 22, 2011

(65) Prior Publication Data
US 2012/0132954 A1   May 31, 2012

(30) Foreign Application Priority Data

Nov. 25, 2010 (JP) ................................ 2010-262395
Oct. 25, 2011 (JP) ................................ 2011-233682

(51) Int. Cl.
*H01L 29/66* (2006.01)

(52) U.S. Cl.
USPC ........................................................ 257/140

(58) Field of Classification Search
None
See application file for complete search history.

(56) References Cited

U.S. PATENT DOCUMENTS

| | | | | |
|---|---|---|---|---|
| 5,360,984 A | * | 11/1994 | Kirihata | 257/143 |
| 6,204,717 B1 | * | 3/2001 | Nagasu et al. | 327/318 |
| 6,465,863 B1 | * | 10/2002 | Deboy et al. | 257/495 |
| 6,552,413 B1 | * | 4/2003 | Hirano et al. | 257/603 |
| 7,456,484 B2 | * | 11/2008 | Ozeki et al. | 257/506 |
| 7,635,909 B2 | * | 12/2009 | Mauder et al. | 257/603 |
| 2007/0158680 A1 | * | 7/2007 | Ozeki et al. | 257/146 |
| 2007/0200138 A1 | | 8/2007 | Ozeki et al. | |
| 2008/0315248 A1 | * | 12/2008 | Tokura et al. | 257/139 |
| 2009/0200574 A1 | * | 8/2009 | Kopta | 257/104 |
| 2009/0289276 A1 | | 11/2009 | Yoshiura et al. | |
| 2010/0244091 A1 | * | 9/2010 | Yoneda et al. | 257/139 |

FOREIGN PATENT DOCUMENTS

| | | |
|---|---|---|
| GB | 2050694 A | 1/1981 |
| JP | A 57-002566 A | 1/1982 |
| JP | 02-66977 A | 3/1990 |
| JP | 2000-114560 A | 4/2000 |

OTHER PUBLICATIONS

Office Action dated Dec. 11, 2012 issued from the Japanese Patent Office for the JP counterpart application No. 2011-233682 (English translation enclosed).

* cited by examiner

*Primary Examiner* — Benjamin Sandvik
(74) *Attorney, Agent, or Firm* — Posz Law Group, PLC

(57) ABSTRACT

A semiconductor device includes a semiconductor substrate with a first surface and a second surface. The semiconductor substrate has an element region including an IGBT region and a diode region located adjacent to the IGBT region. An IGBT element is formed in the IGBT region. A diode element is formed in the diode region. A heavily doped region of first conductivity type is located on the first surface side around the element region. An absorption region of first conductivity type is located on the second surface side around the element region. A third semiconductor region of second conductivity type is located on the second surface side around the element region.

7 Claims, 30 Drawing Sheets

US 8,648,385 B2

SEMICONDUCTOR DEVICE

CROSS REFERENCE TO RELATED APPLICATION

This application is based on and claims priority to Japanese Patent Applications No. 2010-262395 filed on Nov. 25, 2010 and No. 2011-233682 filed on Oct. 25, 2011, the contents of which are incorporated herein by reference.

FIELD

The present invention relates to a semiconductor device.

BACKGROUND

A PIN (P-intrinsic-N) diode is a type of diode. For example, in the PIN diode, a lightly doped N-type semiconductor substrate is sandwiched between a lightly doped P-type semiconductor region as an anode region and a heavily doped N-type semiconductor region as a cathode region. In a power switching element such as a diode, a guard ring is formed around the element to improve voltage breakdown resistance. The guard ring has a multiple-ring structure of a heavily doped P-type semiconductor region. In this type of element, holes that are injected from the heavily doped region around the element are likely to be excessively accumulated around the element. As a result, the element may be broken due to a reduction in a recovery capability around the element. A semiconductor device having an IGBT and a diode that are formed adjacent to each other in a common semiconductor substrate has been known. In this type of device, a lot of holes are injected from a P-type region (e.g., channel region, body region) of the IGBT to the P-type anode region of the diode. As result, it is difficult to reduce a recovery loss of the diode. In JP-A-2001-196606 corresponding to U.S. Pat. No. 6,552,413, JP-A-2-66977, and JP-A-59-49711, the P-type region is distributed in the cathode region of the diode so that the holes can be absorbed by the P-type region. However, when a lot of holes are injected from the guard ring or the IGBT, it is difficult to completely absorb the holes by the P-type region.

SUMMARY

In view of the above, it is an object of the present invention to provide a semiconductor device for reducing a reduction in a recovery capability due to excessive accumulation of minority carriers and for effectively reducing a recovery loss.

According to a first aspect of the present invention, a semiconductor device includes a semiconductor substrate with a first surface and a second surface. The semiconductor substrate has an element region including an IGBT region and a diode region located adjacent to the IGBT region. An IGBT element is formed in the IGBT region. The IGBT element has an emitter electrode on the first surface side, a gate electrode on the first surface side, and a collector electrode on the second surface side. A diode element is formed in the diode region. The diode element has a first semiconductor region of first conductivity type on one of the first surface side and the second surface side and a second semiconductor region of second conductivity type on the other of the first surface side and the second surface side. A heavily doped region of first conductivity type is located on the first surface side around the element region. An absorption region of first conductivity type is located on the second surface side around the element region. A third semiconductor region of second conductivity type is located on the second surface side around the element region.

According to a second aspect of the present invention, a semiconductor device includes a semiconductor substrate with a first surface and a second surface. The semiconductor substrate has an element region including an IGBT region and a diode region located adjacent to the IGBT region. An IGBT element is formed in the IGBT region. The IGBT element has an emitter electrode on the first surface side, a gate electrode on the first surface side, and a collector electrode on the second surface side. A diode element is formed in the diode region. The diode element has a first semiconductor region of first conductivity type on the first surface side and a second semiconductor region of second conductivity type on the second surface side. An absorption region of first conductivity type is located on the second surface side in the diode region. A ratio of the absorption region to the second semiconductor region on the second surface side in the diode region is greater in a first portion than in a second portion. The first portion is located closer to the IGBT region than the second portion.

According to a third aspect of the present invention, a semiconductor device includes a semiconductor substrate having a first surface and a second surface opposite to the first surface. A first semiconductor region is located on the first surface side of the semiconductor substrate. A second semiconductor region of second conductivity type is located on the first surface side of the semiconductor substrate. A first electrode is connected to the first semiconductor region. A second electrode is connected to the second semiconductor region. A guard ring of first conductivity type is located around the first semiconductor region on the first surface side. An absorption region of first conductivity type is located adjacent to the second semiconductor region on the second surface side. A ratio of the absorption region to the second semiconductor region on the second surface side is greater in a first portion than in a second portion. The first portion faces the guard ring in a direction from the first surface to the second surface of the semiconductor substrate. The first portion is located closer to the guard ring than the second portion.

BRIEF DESCRIPTION OF THE DRAWINGS

The above and other objects, features, and advantages will become more apparent from the following description and drawings in which like reference numerals depict like elements. In the drawings.

DETAILED DESCRIPTION OF THE PREFERRED EMBODIMENTS

First Embodiment

Figure 1:
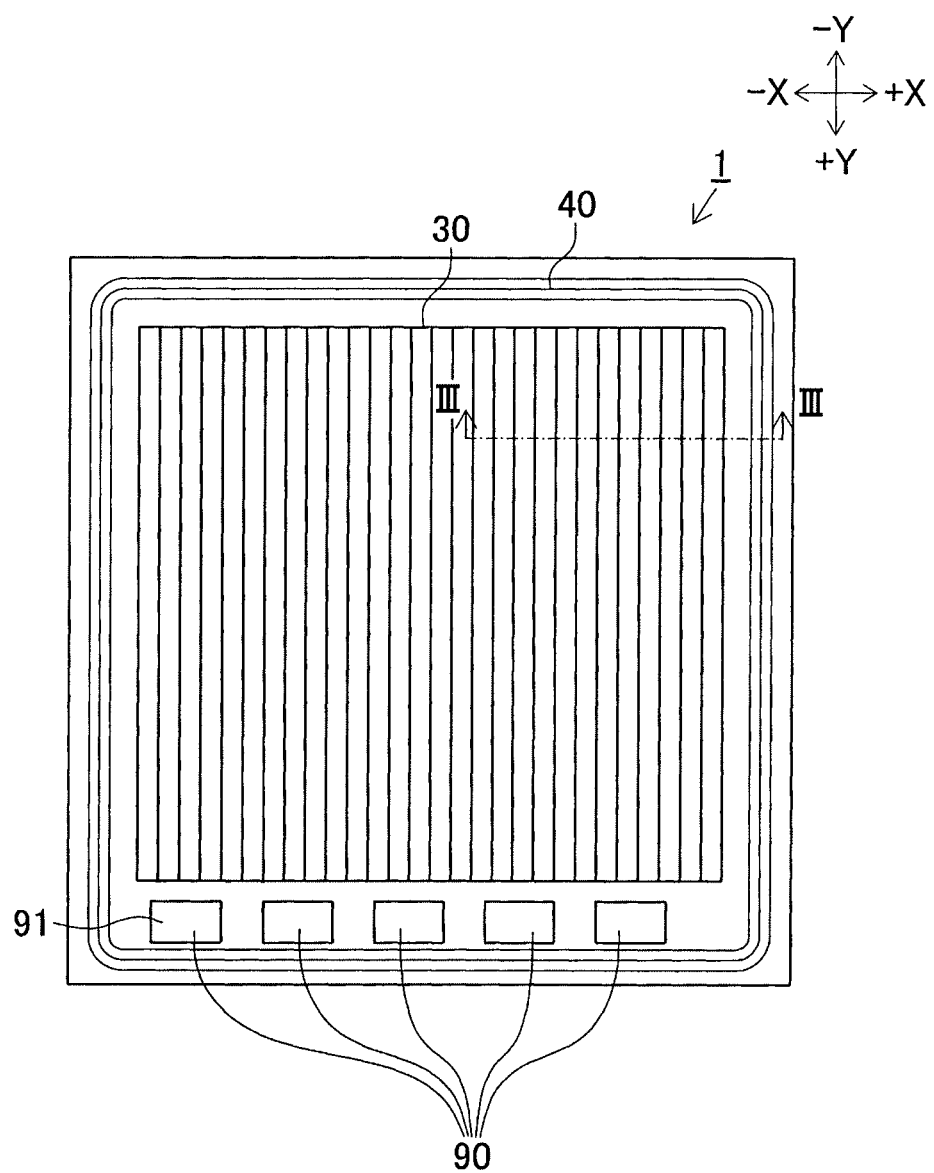
FIG. 1 is a diagram illustrating a front side view of a semiconductor device according to a first embodiment of the present invention.
Figure 2:
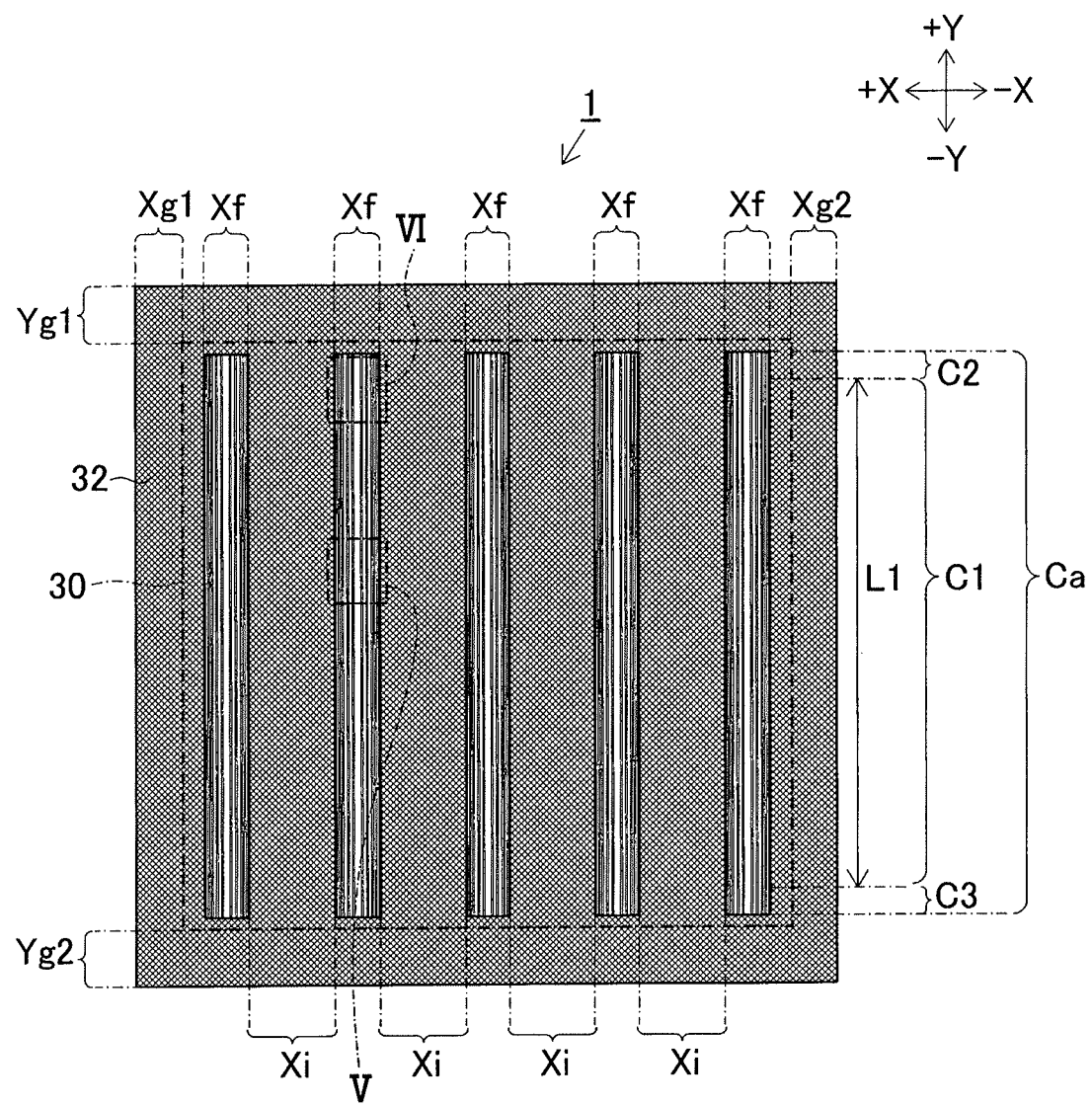
FIG. 2 is a diagram illustrating a back side view of the semiconductor device according to the first embodiment.
Figure 3:
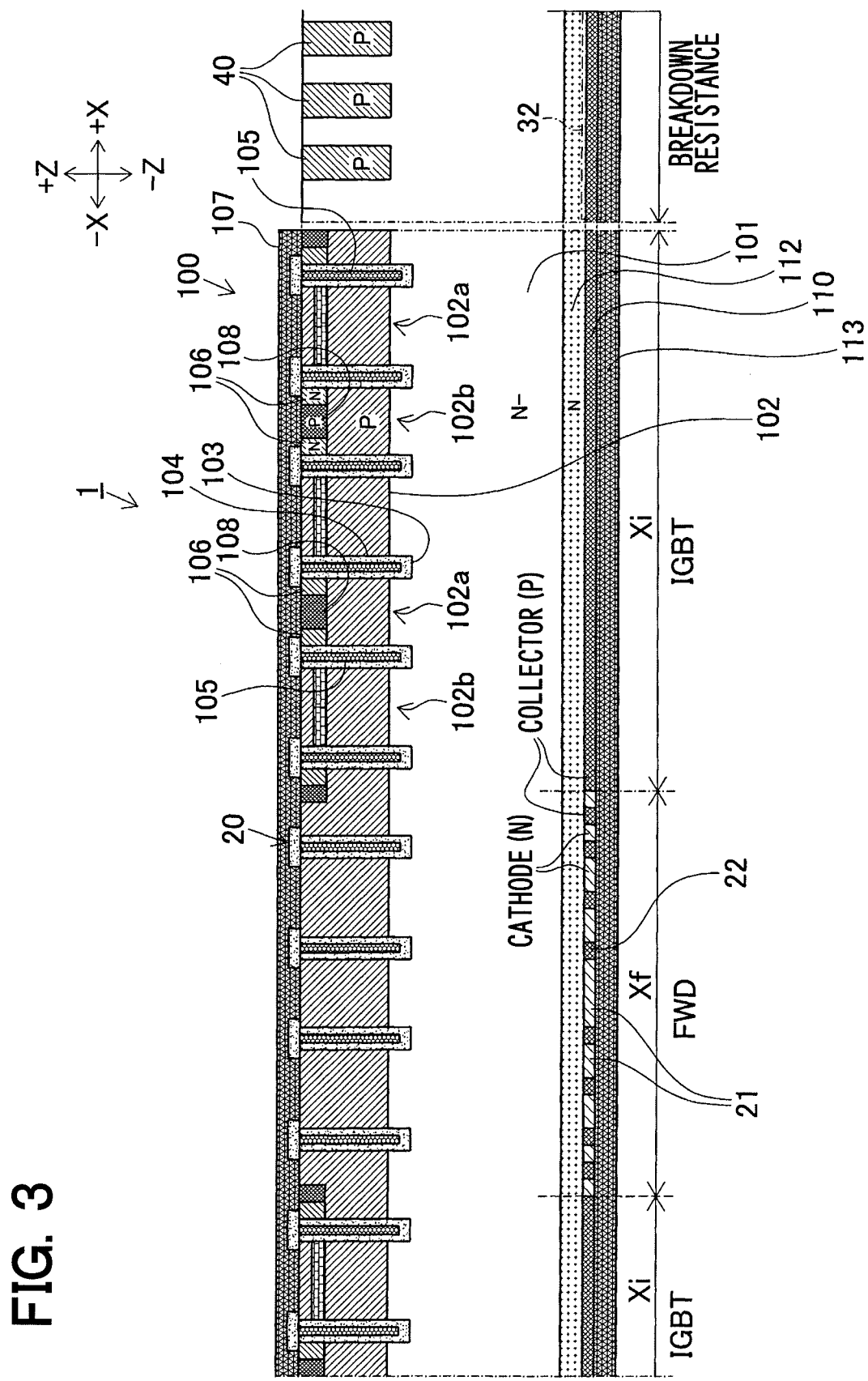
FIG. 3 is a diagram illustrating a cross-sectional view taken along the line III-III in FIG. 1.
Figure 4A:
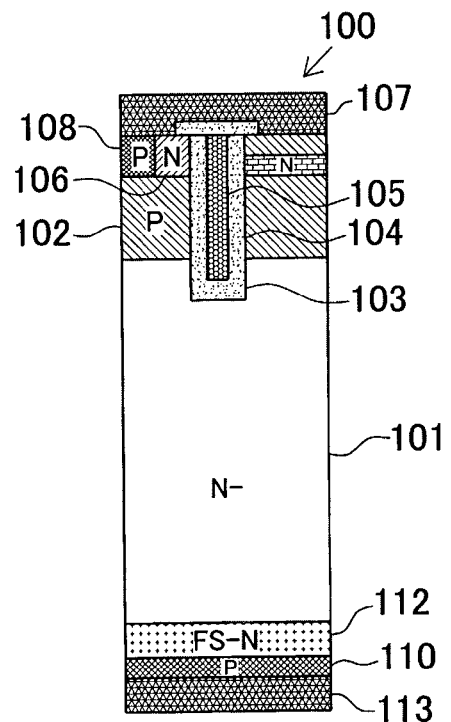
FIG. 4A is a diagram illustrating a cross-sectional view of an IGBT element of the semiconductor device according to the first embodiment.
Figure 4B:
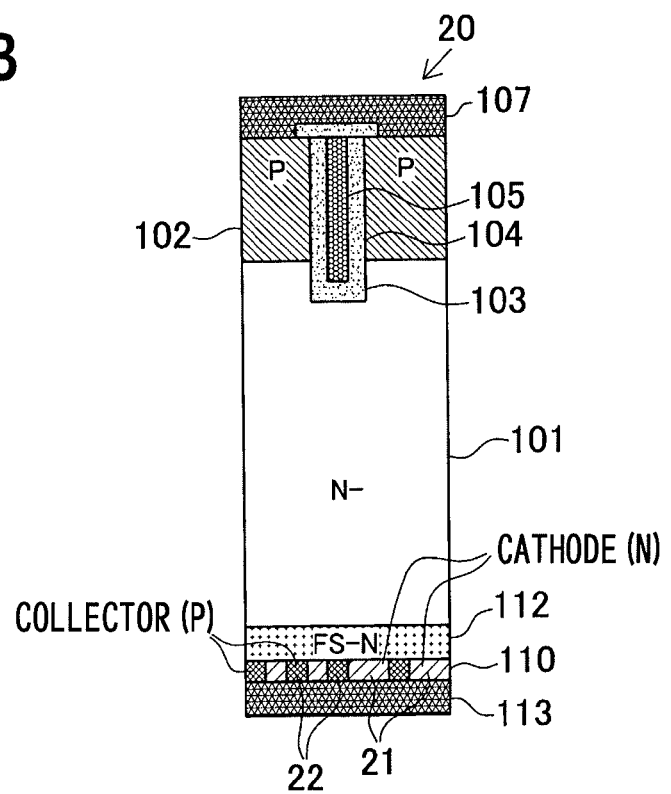
FIG. 4B is a diagram illustrating a cross-sectional view of a FWD element the semiconductor device according to the first embodiment.
Figure 5:
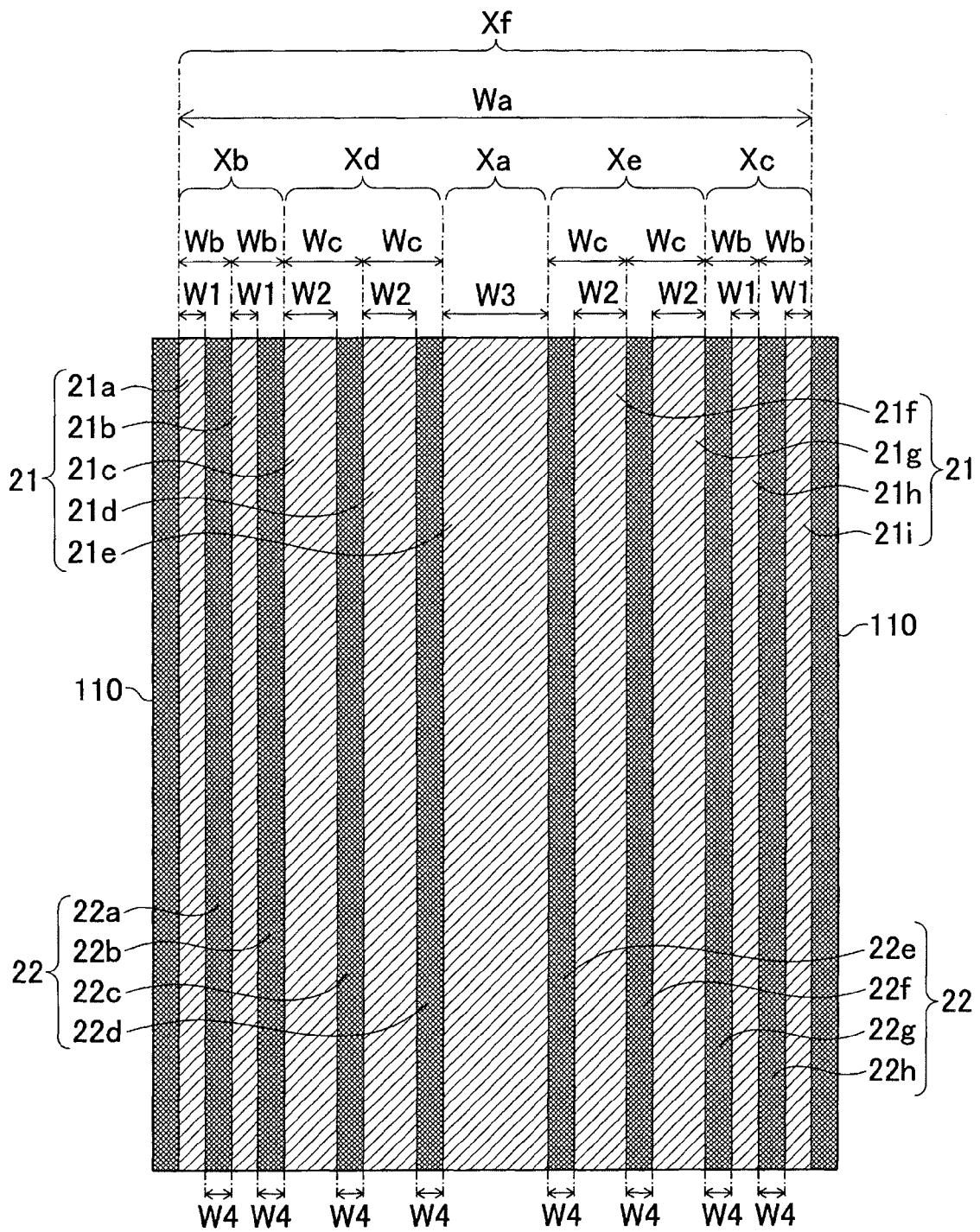
FIG. 5 is a diagram illustrating an enlarged view of a portion V in FIG. 2.
Figure 6:
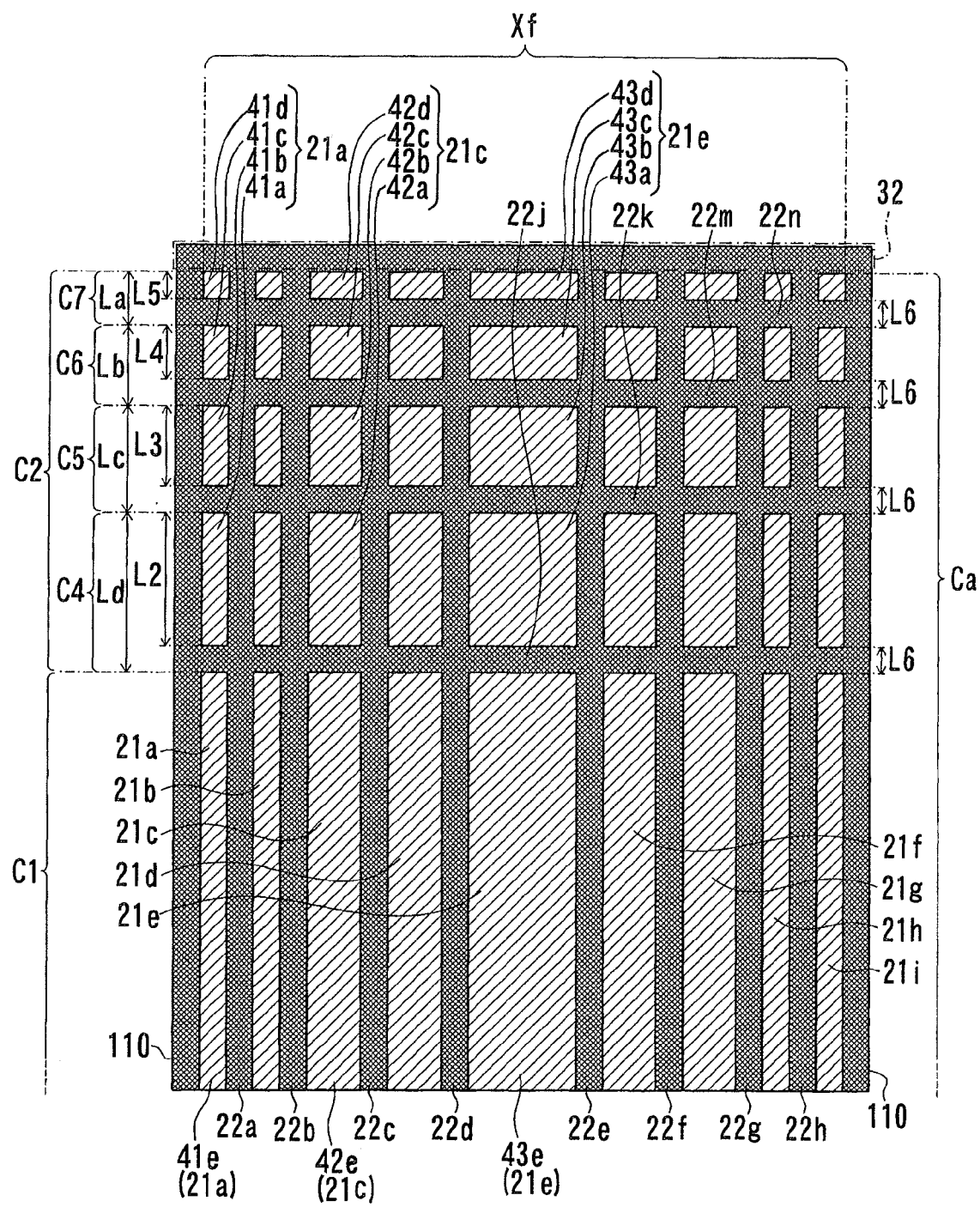
FIG. 6 is a diagram illustrating an enlarged view of a portion VI in FIG. 2.

A semiconductor device 1 according to a first embodiment of the present invention is described below with reference to FIG. 1-7D. FIG. 1 is diagram illustrating a front side view of the semiconductor device 1. FIG. 2 is a diagram illustrating a back side view of the semiconductor device 1. FIG. 3 is a diagram illustrating a cross-sectional view taken along the line in FIG. 1. FIG. 4A is a diagram illustrating a cross-sectional view of an IGBT element of the semiconductor device 1. FIG. 4B is a diagram illustrating a cross-sectional view of a diode element of the semiconductor device 1. FIG. 5 is a diagram illustrating an enlarged view of a portion V in FIG. 2. FIG. 6 is a diagram illustrating an enlarged view of a portion V1 in FIG. 2. FIGS. 7A-7D are diagrams illustrating a method of manufacturing the semiconductor device 1.

As shown in FIG. 3, according to the first embodiment, the semiconductor device 1 includes a trench-gate field stop (FS) insulated gate bipolar transistor (IGBT) element 100 and a free wheeling diode (FWD) element 20. The IGBT element 100 and the FWD element 20 are formed in a common (i.e., the same) semiconductor substrate 101. Specifically, the IGBT element 100 and the FWD element 20 are integrally formed in an element region 30 of the semiconductor substrate 101. As shown in FIG. 1, the element region 30 is located in a center portion of the semiconductor substrate 1. In other words, the element region 30 is not located in an outer edge portion of the semiconductor substrate 1.

The semiconductor substrate 101 has a front (i.e., first) surface and a back (i.e., second) surface opposite to the front surface. The IGBT element 100 is formed in an IGBT region Xi of the element region 30 of the semiconductor substrate 101. As shown in FIGS. 3 and 4A, the IGBT element 100 has a gate electrode 105, an emitter electrode 107, and a collector electrode 113. The gate electrode 105 and the emitter electrode 107 of the IGBT element 100 are formed on the front surface side of the semiconductor substrate 101. In contrast, the collector electrode 113 of the IGBT element 100 is formed on the back surface side of the semiconductor substrate 101.

Multiple FWD elements 20 are formed in a FWD region Xf of the element region 30 of the semiconductor substrate 101. The FWD region Xf is located adjacent to the IGBT region Xi. The FWD element 20 has a P-type (i.e., first conductivity type) anode region (i.e., first semiconductor region) and an N-type (i.e., second conductivity type) cathode region (i.e., second semiconductor region). The anode region is formed in a surface portion of the front surface side of the semiconductor substrate 101. The cathode region is formed in a surface portion of the back surface side of the semiconductor substrate 101. The emitter electrode 107 of the IGBT element 100 serves as an anode electrode of the FWD element 20. The collector electrode 113 of the IGBT element 100 serves as a cathode electrode of the FWD element 20.

The semiconductor substrate 101 is an N$^-$-type FZ wafer and serves as a drift layer. For example, the semiconductor substrate 101 can have an impurity concentration of about $1\times10^{14}$ cm$^{-3}$. In the element region 30, a P-type base region 102 is selectively formed in the surface portion of the front surface side of the semiconductor substrate 101.

The base region 102 serves as a channel region of the IGBT element 100 and the anode region of the FWD element 20. A trench 103 is selectively formed in the base region 102. The trench 103 penetrates the base region 102 and reaches the semiconductor substrate 101. Thus, a bottom of the trench 103 is located in the semiconductor substrate 101. The trench 103 is formed in a predetermined position in a width direction (i.e., X-direction in FIGS. 1, 3) of the semiconductor device 1 and extends in a length direction (i.e., Y-direction in FIG. 1) of the semiconductor device 1. The width direction and the length direction of the semiconductor device 1 are perpendicular to each other. A gate insulation layer 104 is formed on an inner surface of the trench 103. The gate electrode 105 is formed on the gate insulation layer 104 so that the trench 103 can be filled with the gate insulation layer 104 and the gate electrode 105. For example, the gate insulation layer 104 can be an oxide layer, and the gate electrode 105 can be polysilicon with an impurity concentration of about $1\times10^{20}$ cm$^{-3}$.

An N$^+$-type emitter region 106 is selectively formed in the base region 102 and located adjacent to a side wall of the trench 103. As shown in FIG. 3, the base region 102 is divided by the trenches 103 into multiple regions including first and second base regions 102a, 102b. The first and second base regions 102a, 102b are alternately arranged in the width direction. The emitter region 106 is formed only in the first base region 102a. In other word, the emitter region 106 is not formed in the second base region 102b. For example, the emitter region 106 can have a thickness of about 0.5 µm and an impurity concentration of about $1\times10^{19}$ cm$^{-3}$. For example, the emitter electrode 107 can be made of an aluminum-based material. The emitter region 106 is electrically connected to the emitter electrode 107 so that the first base region 102a can be electrically connected to the emitter electrode 107 (i.e., first electrode).

A P$^+$-type body region 108 is selectively formed in the first base region 102a. For example, the body region 108 can have an impurity concentration of about $1\times10^{19}$ cm$^{-3}$ A P$^+$-type collector layer 110 is selectively formed in the surface portion of the back surface side of the semiconductor substrate 101. For example, the collector layer 110 can have a thickness of about 0.5 µm and an impurity concentration of about $1\times10^{18}$ cm$^{-3}$. The collector layer 110 is formed almost all over the IGBT region Xi. Further, as shown in FIG. 3, the collector layer 110 extends to the outer edge portion of the semiconductor substrate 101. That is, a part of the collector layer 110 is located outside the element region 30. The part of the collector layer 110 serves as an opposing region 32. The opposing region 32 faces a guard ring 40 in a thickness direction (i.e., Z-direction in FIG. 3) of the semiconductor device 1. The thickness direction is perpendicular to each of the width direction and the length direction.

An N$^+$-type cathode region 21 is selectively formed in the surface portion of the back surface side of the semiconductor substrate 101. For example, the cathode region 21 can have a thickness of about 0.5 µm and an impurity concentration of about $1\times10^{18}$ cm$^{-3}$. The collector layer 110 and the cathode region 21 are electrically connected to the collector electrode 113 (i.e., second electrode). For example, the collector electrode 113 can be made of an aluminum-based material. Further, a P-type absorption region 22 is formed adjacent to the cathode region 21 in the FWD region Xf. The absorption region 22 is described in detail later.

As shown in FIG. 3, an N-type field stop layer 112 is formed between the semiconductor substrate 101 (i.e., drift layer) and each of the collector layer 110 and the cathode layer 111. Since the field stop layer 112 stops expansion of a depletion layer, a thickness of the semiconductor substrate 101 can be reduced so that the total thickness of the semiconductor device 1 can be reduced. For example, the thickness from a surface of the base region 102 to a surface of the collector layer 110 can be about 130 µm. The surface of the base region 102 defines the front surface of the semiconductor substrate 101, and the surface of the collector layer 110 defines the back surface of the semiconductor substrate 101.

Next, an operation of the IGBT element 100 of the semiconductor device 1 is described below. To drive the IGBT element 100, a predetermined collector voltage is applied between the emitter electrode 107 and the collector electrode 113, and a predetermined gate voltage is applied between the emitter electrode 107 and the gate electrode 105. As a result, a region between the emitter region 106 of the first base region 102a and the semiconductor substrate 101 is inverted to N-type so that a channel can be formed. Electrons are injected from the emitter electrode 107 to the semiconductor substrate 101 through the channel.

The collector layer 110 and the semiconductor substrate 101 are forward biased by the injected electrons so that holes can be injected from the collector layer 110. Thus, a resistance of the semiconductor substrate 101 is much reduced, and a current capacity of the IGBT element 100 is increased. When the gate voltage applied between the emitter electrode 107 and the gate electrode 105 is removed, or when the gate is reverse-biased, the inverted channel region returns to P-type. As a result, the electron injection from the emitter electrode 107 is stopped so that the hole injection from the collector layer 110 can be stopped. Then, the carriers (electron and hole) accumulated in the semiconductor substrate 101 are ejected from the collector electrode 113 and the emitter electrode 107 or recombine and disappear.

Next, an operation of the FWD element 20 of the semiconductor device 1 is described below. The first base region 102a, which is electrically connected to the emitter electrode 107, serves as the anode region of the FWD element 20. That is, the emitter electrode 107 serves as the anode electrode. When a voltage applied between the emitter electrode 107 (i.e., anode electrode) and the semiconductor substrate 101 in a forward bias direction exceeds a threshold voltage, the anode region and the semiconductor substrate 101 are forward biased so that the FWD element 20 can conduct. When a voltage is applied between the emitter electrode 107 (i.e., anode electrode) and the semiconductor substrate 101 in a reverse bias direction, a depletion later extends from the anode region toward the semiconductor substrate 101 so that reverse direction voltage breakdown resistance can be maintained.

As shown in FIGS. 1 and 3, a P-type guard ring (i.e., heavily doped region) 40 is formed in the surface portion of the front surface side of the semiconductor substrate 101. The guard ring 40 is located in the outer edge portion of the semiconductor substrate 101 so that the element region 30 can be surrounded with the guard ring 40. For example, the guard ring 40 can have a multiple-ring structure. The guard ring 40 has a predetermined depth from the front surface of the semiconductor substrate 101. An impurity concentration of the guard ring 40 is higher than the impurity concentration of the base region 102. Pads 91 are formed on the front surface side of the semiconductor substrate 101. Signals are inputted to the semiconductor device 1 through the pads 91. For example, a gate pad 91, which is one of the pads 90, is used to input a drive signal to the gate electrode 12.

The semiconductor device 1 according to the first embodiment is described in detail below. As shown in FIG. 3, the P-type (i.e., first conductivity type) absorption region 22 is selectively formed in the surface portion of the back surface side of the semiconductor substrate 101 in the FWD region Xf. The absorption region 22 is part of the collector layer 110. As shown in FIG. 4B, the absorption region 22 extends in the thickness direction (i.e., Z-direction of FIG. 3) from the collector electrode 113 to the field stop layer 112.

According to the first embodiment, multiple (e.g., four) FWD elements 20 are arranged in the FWD region Xf in the width direction (i.e., X-direction), and multiple (e.g., seven) IGBT elements 100 are arranged in the IGBT region Xi in the width direction (i.e., X-direction). Each of the FWD element 20 and the IGBT element 100 extends in the length direction (i.e., Y-direction).

As shown in FIGS. 3 and 5, the cathode region 21 in the FWD region Xf includes multiple cathode regions 21a-21i. The cathode regions 21a-21i have different widths and extend in the length direction (i.e., Y-direction). The absorption region 22 includes multiple absorption regions 22a-22h. The absorption regions 22a-22h are located between adjacent cathode regions 21a-21i and extend in the length direction (i.e., Y-direction).

Specifically, the cathode regions 21a-21i continuously extend almost parallel to each other in the length direction within a middle region C1 of the FWD region Xf. Likewise, the absorption regions 22a-22h continuously extend almost parallel to each other in the length direction within the middle region C1. The collector layer 110 of the IGBT region Xi is located outside the cathode region 21 (i.e., the outermost cathode regions 21a, 21i) of the FWD region Xf in the width direction.

It is noted that the ratio of the absorption region 22 to the cathode region 21 decreases with a distance from the IGBT element 100. That is, the ratio of the absorption region 22 to the cathode region 21 is higher on the near side of the FWD region Xf from the IGBT region Xi than on the far side of the FWD region Xf from the IGBT region Xi.

Specifically, as shown in FIG. 5, the FWD region Xf includes a first region Xa, a second region Xb, a third region Xc, a fourth region Xd, and a fifth region Xe. The first region Xa is located in the center of the FWD region Xf in the width direction. The second region Xb is located on a first end of the FWD region Xf in the width direction and located adjacent to the IGBT region Xi. The third region Xc is located on a second end of the FWD region Xf in the width direction and located adjacent to the IGBT region Xi. The fourth region Xd is located between the first region Xa and the second region Xb. The fifth region Xe is located between the first region Xa and the third region Xc.

In the first region Xa, the cathode region 21e occupies the entire first region Xa. Since the absorption region 22 is not formed in the first region Xa, the ratio of the width of the absorption region 22 to the width of the first region Xa is zero (i.e., 0%). That is, the ratio of the width of the absorption region 22 to the width W3 of the cathode region 21e is zero.

In the second region Xb, the cathode regions 21a, 21b, each of which has a width W1, are arranged at an interval Wb. Further, the absorption regions 22a, 22b, each of which has a width W4, are arranged at the interval Wb and located adjacent to the cathode regions 21a, 21b. Thus, the absorption regions 22a, 22b are alternately arranged with the cathode regions 21a, 21b. For example, the width W1 of the cathode regions 21a, 21b can be equal to the width W4 of the absorption regions 22a, 22b. In this case, in the second region Xb, the ratio of the width of the absorption region 22 (i.e., total width of the absorption regions 22a, 22b) to the width of the second region Xb is 0.5 (i.e., 50%), and the ratio of the width of the absorption region 22 (i.e., total width of the absorption regions 22a, 22b) to the width of the cathode region 21 (i.e., total width of the cathode regions 21a, 21b) is 1.

In the third region Xc, the cathode regions 21h, 21i, each of which has the width W1, are arranged at the interval Wb. Further, the absorption regions 22g, 22h, each of which has the width W4, are arranged at the interval Wb and located adjacent to the cathode regions 21h, 21i. Thus, the absorption regions 22g, 22h are alternately arranged with the cathode regions 21h, 21i. For example, the width W1 of the cathode regions 21h, 21i can be equal to the width W4 of the absorption regions 22g, 22h. In this case, in the third region Xc, the ratio of the width of the absorption region 22 (i.e., total width of the absorption regions 22g, 22h) to the width of the third region Xc is 0.5 (i.e., 50%), and the ratio of the width of the absorption region 22 (i.e., total width of the absorption regions 22g, 22h) to the width of the cathode region 21 (i.e., total width of the cathode regions 21h, 21i) is 1.

In the fourth region Xd, the cathode regions 21c, 21d, each of which has a width W2, are arranged at an interval Wc. Further, the absorption regions 22c, 22d, each of which has the width W4, are arranged at the interval Wc and located adjacent to the cathode regions 21c, 21d. Thus, the absorption regions 22c, 22d are alternately arranged with the cathode regions 21c, 21d. For example, the width W2 of the cathode regions 21c, 21d can be twice larger than the width W4 of the absorption regions 22c, 22d. That is, W2=2×W4. In this case, in the fourth region Xd, the ratio of the width of the absorption region 22 (i.e., total width of the absorption regions 22c, 22d) to the width of the third region Xc is ⅓ (i.e., about 33%), and the ratio of the width of the absorption region 22 (i.e., total width of the absorption regions 22c, 22d) to the width of the cathode region 21 (i.e., total width of the cathode regions 21c, 21d) is 0.5.

In the fifth region Xe, the cathode regions 21f, 21g, each of which has the width W2, are arranged at an interval Wc. Further, the absorption regions 22e, 22f, each of which has the width W4, are arranged at the interval Wc and located adjacent to the cathode regions 21f, 21g. Thus, the absorption regions 22e, 22f are alternately arranged with the cathode regions 21f, 21g. For example, the width W2 of the cathode regions 21f, 21g can be twice larger than the width W4 of the absorption regions 22e, 22f. That is, W2=2×W4. In this case, in the fifth region Xe, the ratio of the width of the absorption region 22 (i.e., total width of the absorption regions 22e, 22f) to the width of the fifth region Xe is ⅓ (i.e., about 33%), and the ratio of the width of the absorption region 22 (i.e., total width of the absorption regions 22e, 22f) to the width of the cathode region 21 (i.e., total width of the cathode regions 21f, 21g) is 0.5.

As described above, according to the first embodiment, in the first region Xa that is located furthest away from the IGBT region Xi in the width direction, the ratio of the width of the absorption region 22 to the width of the cathode region 21 is zero. In the fourth region Xd that is located closer to the IGBT region Xi than the first region Xa on a first side in the width direction, the ratio of the width of the absorption region 22 to the width of the cathode region 21 is 0.5. In the second region Xb that is located closer to the IGBT region Xi than the fourth region Xa on the first side in the width direction, the ratio of the width of the absorption region 22 to the width of the cathode region 21 is 1. Thus, on the first side in the width direction, the ratio of the width of the absorption region 22 to the width of the cathode region 21 decreases stepwise (e.g., in three steps) with the distance from the IGBT region Xi in the width direction.

Likewise, in the fifth region Xe that is located closer to the IGBT region Xi than the first region Xa on a second side in the width direction, the ratio of the width of the absorption region 22 to the width of the cathode region 21 is 0.5. In the third region Xc that is located closer to the IGBT region Xi than the fifth region Xe on the second side in the width direction, the ratio of the width of the absorption region 22 to the width of the cathode region 21 is 1. Thus, on the second side in the width direction, the ratio of the width of the absorption region 22 to the width of the cathode region 21 decreases stepwise (e.g., in three steps) with the distance from the IGBT region Xi in the width direction.

In summary, according to the first embodiment, the ratio of the absorption region 22 to the cathode region 21 is higher on the near side of the FWD region Xf from the IGBT region Xi than on the far side of the FWD region Xf from the IGBT region Xi. In such an approach, holes accumulated on the near side of the FWD region Xf from the IGBT region Xi are effectively absorbed so that recovery loss can be effectively reduced.

Further, according to the first embodiment, as shown in FIG. 1, the P-type guard ring 40 having a multiple-ring structure is formed on the front surface side of the semiconductor substrate 101 around the element region 30. As shown in FIG. 6, the ratio of the absorption region 22 to the cathode region 21 is higher on the near side of the FWD region Xf from the opposing region 32 than on the far side of the FWD region Xf from the opposing region 32.

Specifically, as shown in FIGS. 1-3, the guard ring 40 is formed in the surface portion of the front surface of the semiconductor substrate 101 around the element region 30, and the opposing region 32 is formed in the surface portion of the back surface of the semiconductor substrate 101 around the element region 30 so that the opposing region 32 and the guard ring 40 can face each other in the thickness direction. More specifically, as shown in FIG. 2, the opposing region 32 has a first region Yg1, a second region Yg2, a third region Xg1, and a fourth region Xg2. The first region Yg1 is located at a first edge of the semiconductor substrate 101 in the length redirection (+Y-direction). The second region Yg2 is located at a second edge of the semiconductor substrate 101 in the length redirection (−Y-direction). The third region Xg1 is located at a third edge of the semiconductor substrate 101 in the width direction (+X-direction). The fourth region Xg2 is located at a fourth edge of the semiconductor substrate 101 in the width direction (−X-direction). The first to fourth regions Yg1, Yg2, Xg1, and Xg2 are joined together to form a rectangular ring shape. In this way, the ring-shaped opposing region 32 is formed in the surface portion of the back surface of the semiconductor substrate 101 around the element region 30. The opposing region 32 is a P-type semiconductor region and formed at the same depth as the cathode region 21, the absorption region 22, and the collector layer 110. Specifically, the collector layer 110 continuously extends from inside to outside the element region 30, and a portion of the collector layer 110 located outside the element region 30 defines the opposing region 32.

As shown in FIG. 2, the FWD region Xf is located adjacent to the opposing region 32 in the length direction. Specifically, a first end region C2 of the FWD region Xf is located adjacent to the first region Yg1 of the opposing region 32, and a second end region C3 of the FWD region Xf is located adjacent to the second region Yg2 of the opposing region 32. As shown in FIG. 6, the cathode region 21 within the first end region C2 is divided into multiple regions by absorption regions 22*j*, 22*k*, 22*m*, and 22*n*. The absorption regions 22*j*, 22*k*, 22*m*, and 22*n* have the same width L6 and extend parallel to each other in the width direction. Although not shown in the drawings, the cathode region 21 within the second end region C3 is divided into multiple regions in the same manner as the cathode region 21 within the first end region C2.

Specifically, the cathode region 21*a* within the first end region C2 is divided into divisional regions 41*a*, 41*b*, 41*c*, and 41*d* by the absorption regions 22*j*, 22*k*, 22*m*, and 22*n*. The divisional regions 41*a*, 41*b*, 41*c*, and 41*d* are arranged in this order in the length direction in such a manner that the divisional region 41*a* is located furthest away from the opposing region 32. In other words, the divisional regions 41*a*, 41*b*, 41*c*, and 41*d* are arranged in this order in the length direction in such a manner that the divisional region 41*d* is located closest to the opposing region 32. A length L2 of the divisional region 41*a* is longer than a length L3 of the divisional region 41*b* in the length direction. The length L3 of the divisional region 41*b* is longer than a length L4 of the divisional region 41*c* in the length direction. The length L4 of the divisional region 41*c* is longer than a length L5 of the divisional region 41*d* in the length direction. That is, the lengths L2, L3, L4, and L5 of the divisional regions 41*a*, 41*b*, 41*c*, and 41*d* have the following relationships: L5<L4<L3<L2. It is the length of the cathode region 21*a* within the middle region C1 is sufficiently longer than the length L2 of the divisional region 41*a*.

In the first end region C2, an interval at which the cathode region 21*a* is arranged in the length direction is smaller as the cathode region 21*a* is located closer to the opposing region 32. Specifically, the divisional region 41*d*, 41*c*, 41*b*, and 41*a* are arranged in the length direction at intervals La, Lb, Lc, and Ld from the opposing region 32 to the middle region C1. Thus, the ratio of the absorption region 22 to the cathode region 21 is larger as the cathode region 21 is located closer to the opposing region 32. Specifically, the ratio of the absorption region 22*n* to the cathode region 21*d* in a region C7 located adjacent to the opposing region 32 is larger than the ratio of the absorption region 22*m* to the cathode region 21*c* in a region C6 located further away from the opposing region 32 than the region C7. The ratio of the absorption region 22*m* to the cathode region 21*c* in the region C6 is larger than the ratio of the absorption region 22*k* to the cathode region 21*b* in a region C5 located further away from the opposing region 32 than the region C6. The ratio of the absorption region 22*k* to the cathode region 21*b* in the region C5 is larger than the ratio of the absorption region 22*j* to the cathode region 21*a* in a region C4 located further away from the opposing region 32 than the region C5.

Each of the cathode regions 21*b*, 21*h*, and 21*i* within the first end region C2 is divided and arranged in the length direction in the same manner as the cathode region 21*a*.

The cathode region 21*c* within the first end region C2 is divided into divisional regions 42*a*, 42*b*, 42*c*, and 42*d* by the absorption regions 22*j*, 22*k*, 22*m*, and 22*n*. The divisional regions 42*a*, 42*b*, 42*c*, and 42*d* are arranged in this order in the length direction in such a manner that the divisional region 42*a* is located furthest away from the opposing region 32. In other words, the divisional regions 41*a*, 41*b*, 41*c*, and 41*d* are arranged in this order in the length direction in such a manner that the divisional region 42*d* is located closest to the opposing region 32. The length L2 of the divisional region 42*a* is longer than the length L3 of the divisional region 42b in the length direction. The length L3 of the divisional region 42b is longer than the length L4 of the divisional region 42c in the length direction. The length L4 of the divisional region 42c is longer than the length L5 of the divisional region 42d in the length direction. That is, the lengths L2, L3, L4, and L5 of the divisional regions 42a, 42b, 42c, and 42d have the following relationships: L5<L4<L3<L2. It is the length of the cathode region 21c within the middle region C1 is sufficiently longer than the length L2 of the divisional region 42a.

In the first end region C2, an interval at which the cathode region 21c is arranged in the length direction is smaller as the cathode region 21c is located closer to the opposing region 32. Specifically, the divisional region 42d, 42c, 42b, and 42a are arranged in the length direction at the intervals La, Lb, Lc, and Ld from the opposing region 32 to the middle region C1. Thus, the ratio of the absorption region 22 to the cathode region 21 is larger as the cathode region 21 is located closer to the opposing region 32. Specifically, the ratio of the absorption region 22n to the cathode region 42d in the region C7 is larger than the ratio of the absorption region 22m to the cathode region 42c in the region C6. The ratio of the absorption region 22m to the cathode region 42c in the region C6 is larger than the ratio of the absorption region 22k to the cathode region 42b in the region C5. The ratio of the absorption region 22k to the cathode region 42b in the region C5 is larger than the ratio of the absorption region 22j to the cathode region 42a in the region C4.

Each of the cathode regions 21d, 21f, and 21g within the first end region C2 is divided and arranged in the length direction in the same manner as the cathode region 21c.

The cathode region 21e within the first end region C2 is divided into divisional regions 43a, 43b, 43c, and 43d by the absorption regions 22j, 22k, 22m, and 22n. The divisional regions 43a, 43b, 43c, and 43d are arranged in this order in the length direction in such a manner that the divisional region 43a is located furthest away from the opposing region 32. In other words, the divisional regions 43a, 43b, 43c, and 43d are arranged in this order in the length direction in such a manner that the divisional region 43d is located closest to the opposing region 32. The length L2 of the divisional region 43a is longer than the length L3 of the divisional region 43b in the length direction. The length L3 of the divisional region 43b is longer than the length L4 of the divisional region 43c in the length direction. The length L4 of the divisional region 43c is longer than the length L5 of the divisional region 43d in the length direction. That is, the lengths L2, L3, L4, and L5 of the divisional regions 43a, 43b, 43c, and 43d have the following relationships: L5<L4<L3<L2. It is the length of the cathode region 21e within the middle region C1 is sufficiently longer than the length L2 of the divisional region 43a.

In the first end region C2, an interval at which the cathode region 21e is arranged in the length direction is smaller as the cathode region 21e is located closer to the opposing region 32. Specifically, the divisional region 43d, 43c, 43b, and 43a are arranged in the length direction at the intervals La, Lb, Lc, and Ld from the opposing region 32 to the middle region C1. Thus, the ratio of the absorption region 22 to the cathode region 21 is larger as the cathode region 21 is located closer to the opposing region 32. Specifically, the ratio of the absorption region 22n to the cathode region 43d in the region C7 is larger than the ratio of the absorption region 22m to the cathode region 43c in the region C6. The ratio of the absorption region 22m to the cathode region 43c in the region C6 is larger than the ratio of the absorption region 22k to the cathode region 43b in the region C5. The ratio of the absorption region 22k to the cathode region 43b in the region C5 is larger than the ratio of the absorption region 22j to the cathode region 43a in the region C4.

As described above, regardless of the position of the cathode region 21 in the width direction (i.e., in any of the cathode regions 21a-21i), the ratio of the absorption region 22 to the cathode region 21 is larger as the cathode region 21 is located closer to the opposing region 32. Therefore, in the FWD region Xf as a whole, the ratio of the absorption region 22 to the cathode region 21 is larger as the cathode region 21 is located closer to the opposing region 32. That is, in the FWD region Xf as a whole, the ratio of the absorption region 22 to the cathode region 21 increases stepwise in the length direction from the middle region C1, which is located furthest away from the opposing region 32, to the region C7, which is located closest to the opposing region 32.

In the FWD region Xf, the surface portion of the back surface of the semiconductor substrate 101 is symmetrically structured with respect to a center line CL in FIG. 2. The center line CL is located in the center of the FWD region Xf in the length direction and extends in the width direction. Thus, the cathode region 21 within the second end region C3 is divided and arranged in the same manner as the cathode region 21 within the first end region C2. That is, the cathode region 21 within the second end region C3 is structured as shown in FIG. 6.

As described above, according to the first embodiment, in the FWD region Xf, the ratio of the absorption region 22 to the cathode region 21 increases stepwise in the length direction from the middle region C1, which is located furthest away from the opposing region 32, to the region C7, which is located closest to the opposing region 32. Further, in the FWD region Xf, the ratio of the absorption region 22 to the cathode region 21 increases stepwise in the width direction toward the IGBT region Xi. Thus, in the FWD region Xf, the ratio of the absorption region 22 to the cathode region 21 increases stepwise in both the length direction and the width direction. Therefore, the ratio of the absorption region 22 to the cathode region 21 is maximized at corner portions of the rectangular FWD region Xf. That is, the effect of absorbing holes is maximized at the corner portions of the FWD region Xf.

For example, at least one of the widths W1, W2, and W3 of the cathode regions 21a-21i can be determined so that a ratio Wn/Lh can be in a range from 0.5 to 1.0, where Wn represents a cathode region width, and Lh represents a hole diffusion length.

Figure 7A:
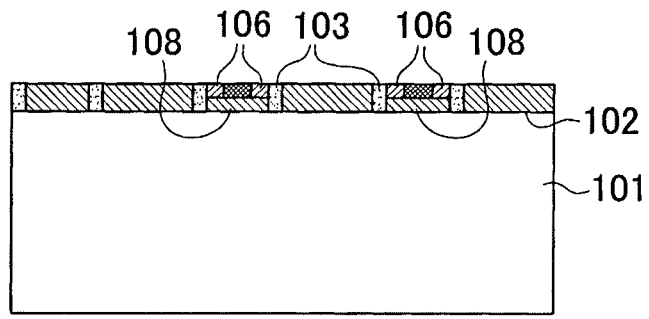
FIGS. 7A-7D are diagrams illustrating a method of manufacturing the semiconductor device according to the first embodiment.
Figure 7B:
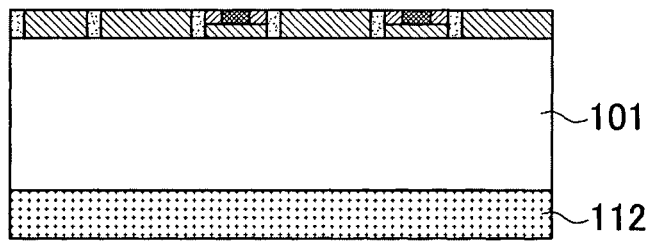
Figure 7C:
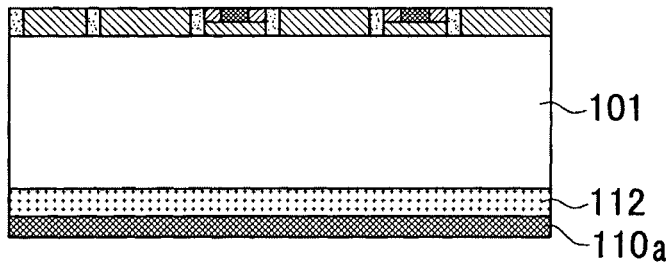
Figure 7D:
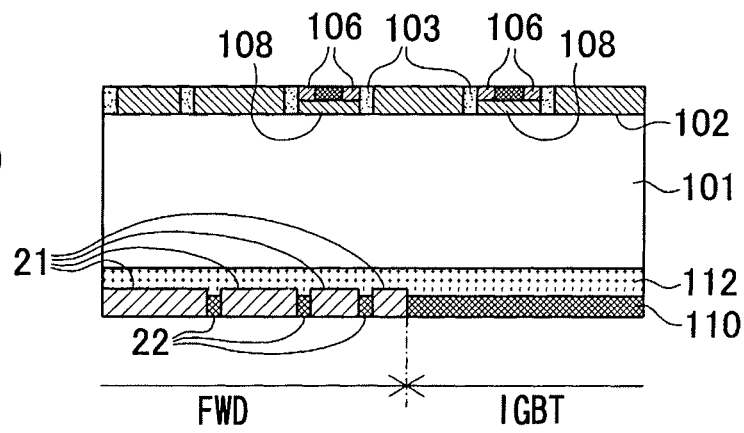

Next, a method of manufacturing the semiconductor device 1 according to the first embodiment is described below with reference to FIGS. 7A-7D. Firstly, as shown in FIG. 7A, the base region 102, the trench 103, the emitter region 106, and, the body region 108 are formed on the front surface side of the semiconductor substrate 101 by a known method. Further, the back surface side of the semiconductor substrate 101 is polished. Then, as shown in FIG. 7B, N-type impurities are implanted into the entire back surface to form the field stop layer 112. Then, P-type impurities are implanted into the field stop layer 112 to form a P-type semiconductor region 110a for the collector layer 110 and the absorption region 22. There is a need that the amount of P-type impurities implanted in the process in FIG. 7C is large enough to cancel the N-type impurities implanted in the process shown in FIG. 7B. Then, a mask (not shown) is formed on the P-type semiconductor region 110a. The mask has an opening at a position corresponding to the cathode region 21 so that a portion of the P-type semiconductor region 110a to be the cathode region 21 can be exposed through the opening outside the mask. In other words, a portion of the P-type semiconductor region 110a to be the collector layer 110, the opposing region 32 and the absorption region 22 is covered with the mask. Then, N-type impurities are implanted into the P-type semiconductor region 110a through the mask to form the cathode region 21. Then, the back surface side of the semiconductor substrate 101 is annealed to activate the implanted impurities. Thus, the semiconductor device 1 is manufactured.

Advantages of the first embodiment are summarized below. According to the first embodiment, the IGBT element 100 and the FWD element 20 are formed in the IGBT region Xi and the FWD region Xf of the semiconductor substrate 101. The IGBT region Xi and the FWD region Xf are located adjacent to each other. The absorption region 22 of P-type (i.e., first conductivity type) is partially formed on the back surface side of the FWD region Xf in such a manner that the ratio of the absorption region 22 to the cathode region 21 (i.e., second semiconductor region) is greater on the near side of the FWD region Xf from the IGBT region Xi than on the far side of the FWD region Xf from the IGBT region Xi. In such an approach, holes (i.e., minority carriers), which are accumulated near an interface between the IGBT element 100 and the FWD element 20, are electively absorbed by the absorption region 22. Thus, a reduction in a recovery capability due to excessive accumulation of minority carriers can be effectively reduced.

Further, according to the first embodiment, the guard ring 40 of P-type (i.e., first conductivity type) is formed on the front surface side of the semiconductor substrate 101 in such a manner that the element region 30 including the IGBT region Xi and the FWD region Xf is surrounded with the guard ring 40. Thus, a voltage breakdown resistance can be improved. Further, the absorption region 22 of P-type (i.e., first conductivity type) is partially formed on the back surface side of the FWD region Xf in such a manner that the ratio of the absorption region 22 to the cathode region 21 (i.e., second semiconductor region) is greater on the near side of the FWD region Xf from the guard ring 40 than on the far side of the FWD region Xf from the guard ring 40. Specifically, the ratio of the absorption region 22 to the cathode region 21 is greater on the near side of the FWD region Xf from the opposing region 32 facing the guard ring 40 than on the far side of the FWD region Xf from the opposing region 32. In such an approach, holes (i.e., minority carriers) injected from the guard ring 40 are electively absorbed by the absorption region 22. Thus, a reduction in a recovery capability due to excessive accumulation of minority carriers can be effectively reduced.

First Modification of the First Embodiment

Figure 8:
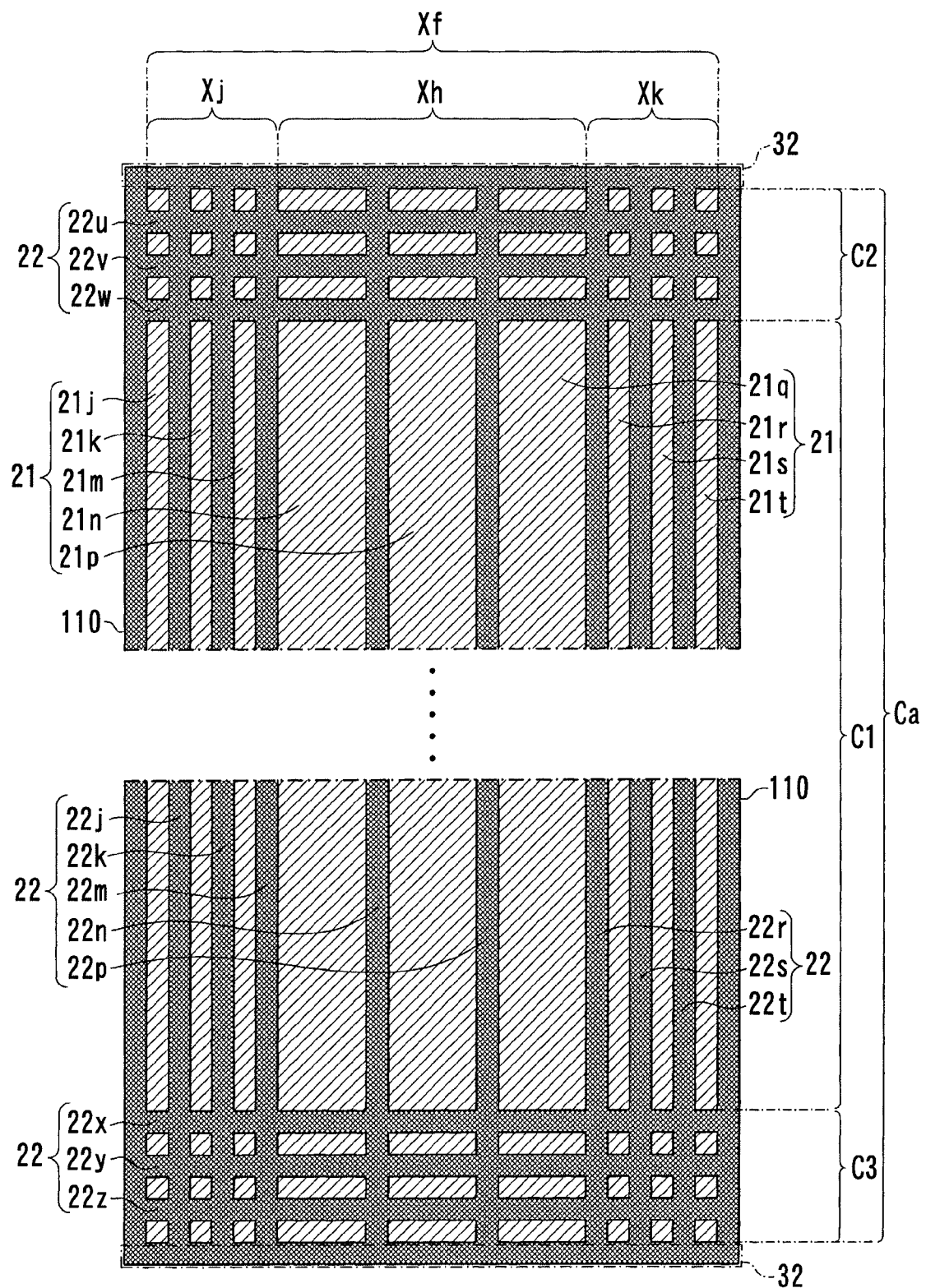
FIG. 8 is a diagram illustrating a back side view of a portion of a semiconductor device according to a first modification of the first embodiment.

A first modification of the first embodiment is described below with reference to FIG. 8. FIG. 8 corresponds to FIG. 6 and illustrates the surface portion of the back surface side of the FWD region Xf.

As shown in FIG. 8, according to the first modification of the first embodiment, cathode regions 21j, 21k, 21m, 21n, 21p, 21q, 21r, 21s, and 21t extend parallel to each other within the middle region C1 in the length direction (i.e., Y-direction in FIG. 2) of the FWD region Xf. The cathode regions 21j, 21k, 21m are located in a first end region Xj of the FWD region Xf in the width direction. The cathode regions 21n, 21p, 21q are located in a middle region Xh of the FWD region Xf in the width direction. The cathode regions 21r, 21s, 21t are located in a second end region Xj of the FWD region Xf in the width direction. The middle region Xf is located further away from the IGBT region Xi than the first end region Xj and the second end region Xk in the width direction.

Further, absorption regions 22j, 22k, 22m, 22n, 22p, 22r, 22s, and 22t extend parallel to each other within the middle region C1 in the length direction. The cathode regions 21j, 21k, 21m, 21n, 21p, 21q, 21r, 21s, and 21t are alternately arranged with the absorption regions 22j, 22k, 22m, 22n, 22p, 22r, 22s, and 22t in the width direction. For example, the absorption regions 22j, 22k, 22m, 22n, 22p, 22r, 22s, and 22t can have the same width.

The cathode regions 21j, 21k, 21m, 21r, 21s, and 21t have the same width. Further, the width of each of the cathode regions 21j, 21k, 21m, 21r, 21s, and 21t is almost equal to the width of each of the absorption regions 22j, 22k, 22m, 22n, 22p, 22r, 22s, and 22t. The cathode regions 21n, 21p, 21q have the same width. Therefore, the ratio of the absorption region 22 to the cathode region 21 is greater on the near side of the FWD region Xf from the IGBT region Xi than on the far side of the FWD region Xf from the IGBT region Xi. Specifically, the ratio of the absorption region 22 to the cathode region 21 is greater in each of the end regions Xj, Xk than in the middle region Xh. Thus, the ratio of the absorption region 22 to the cathode region 21 changes in two steps in the width direction.

The cathode regions 21j, 21k, 21m, 21n, 21p, 21q, 21r, 21s, and 21t within the middle region C1 continuously extend in the length direction. In contrast, the cathode regions 21j, 21k, 21m, 21n, 21p, 21q, 21r, 21s, and 21t within the first end region C2 are divided into multiple divisional regions by absorption regions 22u, 22v, 22w that extend in the width direction. Likewise, the cathode regions 21j, 21k, 21m, 21n, 21p, 21q, 21r, 21s, and 21t within the second end region C3 are divided into multiple divisional regions by absorption regions 22x, 22y, 22z that extend in the width direction. Although the cathode regions 21j, 21k, 21m, 21n, 21p, 21q, 21r, 21s, and 21t are divided within the end regions C2, C3 by the absorption regions 22u, 22v, 22w 22x, 22y, and 22z, the width of each of the cathode regions 21j, 21k, 21m, 21n, 21p, 21q, 21r, 21s, and 21t is uniform over an entire region Ca of the FWD region Xf in the length direction. Therefore, the ratio of the absorption region 22 to the cathode region 21 is greater on the near side of the FWD region Xf from the opposing region 32 than on the far side of the FWD region Xf from the opposing region 32. Specifically, the ratio of the absorption region 22 to the cathode region 21 is greater in each of the end regions C2, C3 than in the middle region C1.

Thus, in the end regions C2, C3, the ratio of the absorption region 22 to the cathode region 21 is greater in the end regions Xj, Xk than in the middle region Xh. Therefore, the ratio of the absorption region 22 to the cathode region 21 is maximized at the corner portions of the rectangular FWD region Xf so that the effect of absorbing holes can be maximized at the corner portions of the FWD region Xf.

Second Modification of the First Embodiment

Figure 9:
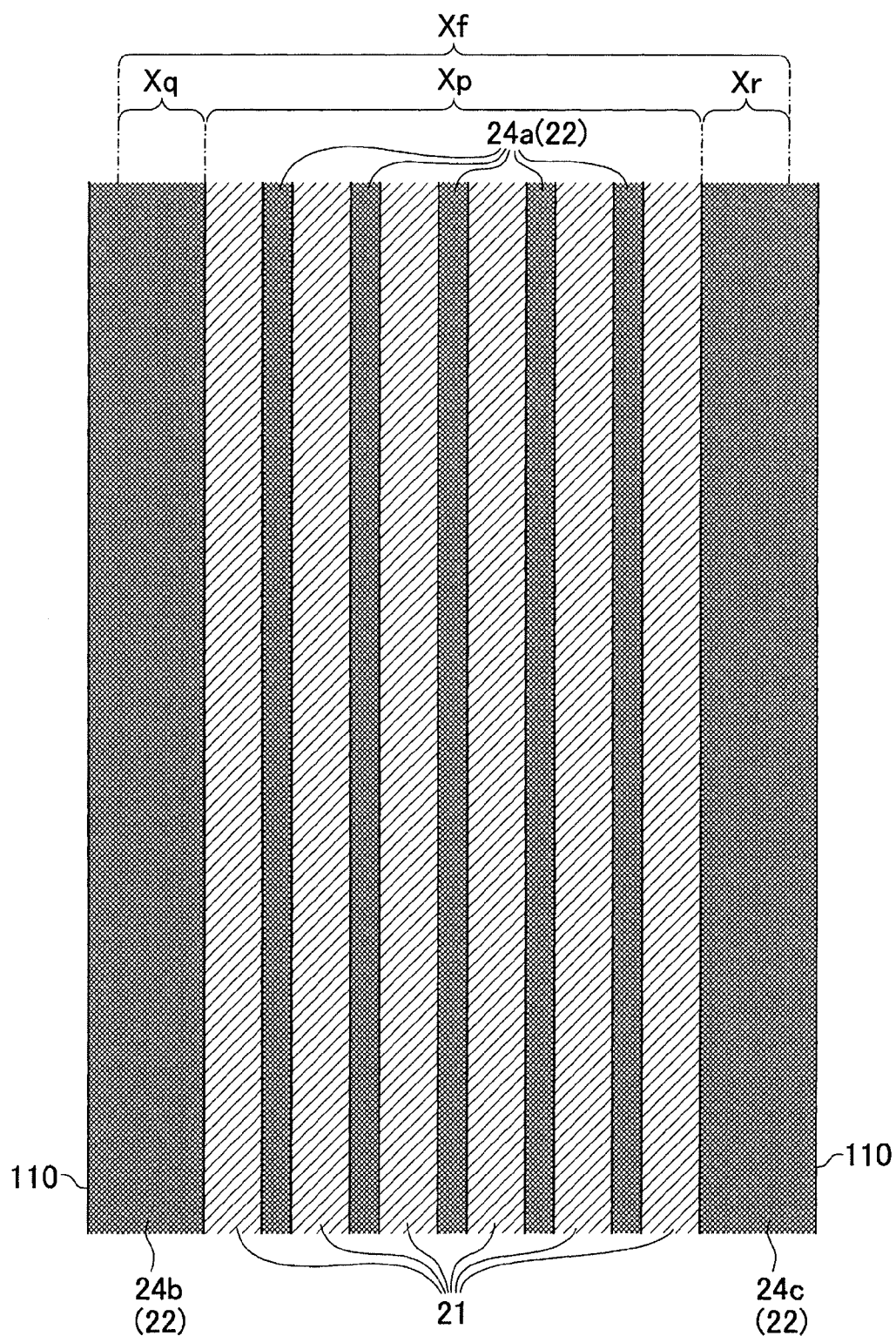
FIG. 9 is a diagram illustrating a back side view of a portion of a semiconductor device according to a second modification of the first embodiment.

A second modification of the first embodiment is described below with reference to FIG. 9. FIG. 9 corresponds to FIG. 5 and illustrates the surface portion of the back surface side of the FWD region Xf.

As shown in FIG. 9, according to the second modification of the first embodiment, the cathode region 21 is not located in end regions Xq, Xr of the FWD region Xf in the width direction. In other words, only absorption regions 24b, 24c are located in the respective end regions Xq, Xr. Thus, the ratio of the absorption region 22 to the cathode region 21 is maximized in the end portions Xq, Xr. The end regions Xq, Xr are located closer to the IGBT region Xi than a middle region Xp of the FWD region Xf in the width direction. Thus, the ratio of the absorption region 22 to the cathode region 21 is maximized on the near side of the FWD region Xf from the IGBT region Xi.

In the middle region Xh of the FWD region Xf, the cathode regions 21 having the same width continuously extend in the length direction. Further, absorption regions 24a having the same width continuously extend in the length direction. The cathode regions 21 are alternately arranged with the absorption regions 24a in the width direction. Thus, the ratio of the absorption region 22 to the cathode region 21 is greater in each of the end regions Xq, Xr than in the middle region Xp. That is, the ratio of the absorption region 22 to the cathode region 21 is greater on the near side of the FWD region Xf from the IGBT region Xi than on the far side of the FWD region Xf from the IGBt region Xi.

FIG. 9 illustrates the cathode regions 21 within the middle portion C1 of the FWD region Xf in the length direction. For example, the cathode regions 21 within the end portions C2, C3 in the length direction can be arranged in the same manner as shown in FIG. 9. That is, the cathode regions 21 within the end portions C2, C3 can continuously extend in the length direction. Alternatively, the cathode regions 21 within the end portions C2, C3 can be arranged in the same manner as shown in FIG. 6 or 8. That is, the cathode regions 21 within the end portions C2, C3 can be divided into multiple divisional regions by the absorption regions that extend in the width direction.

Third Modification of the First Embodiment

Figure 10:
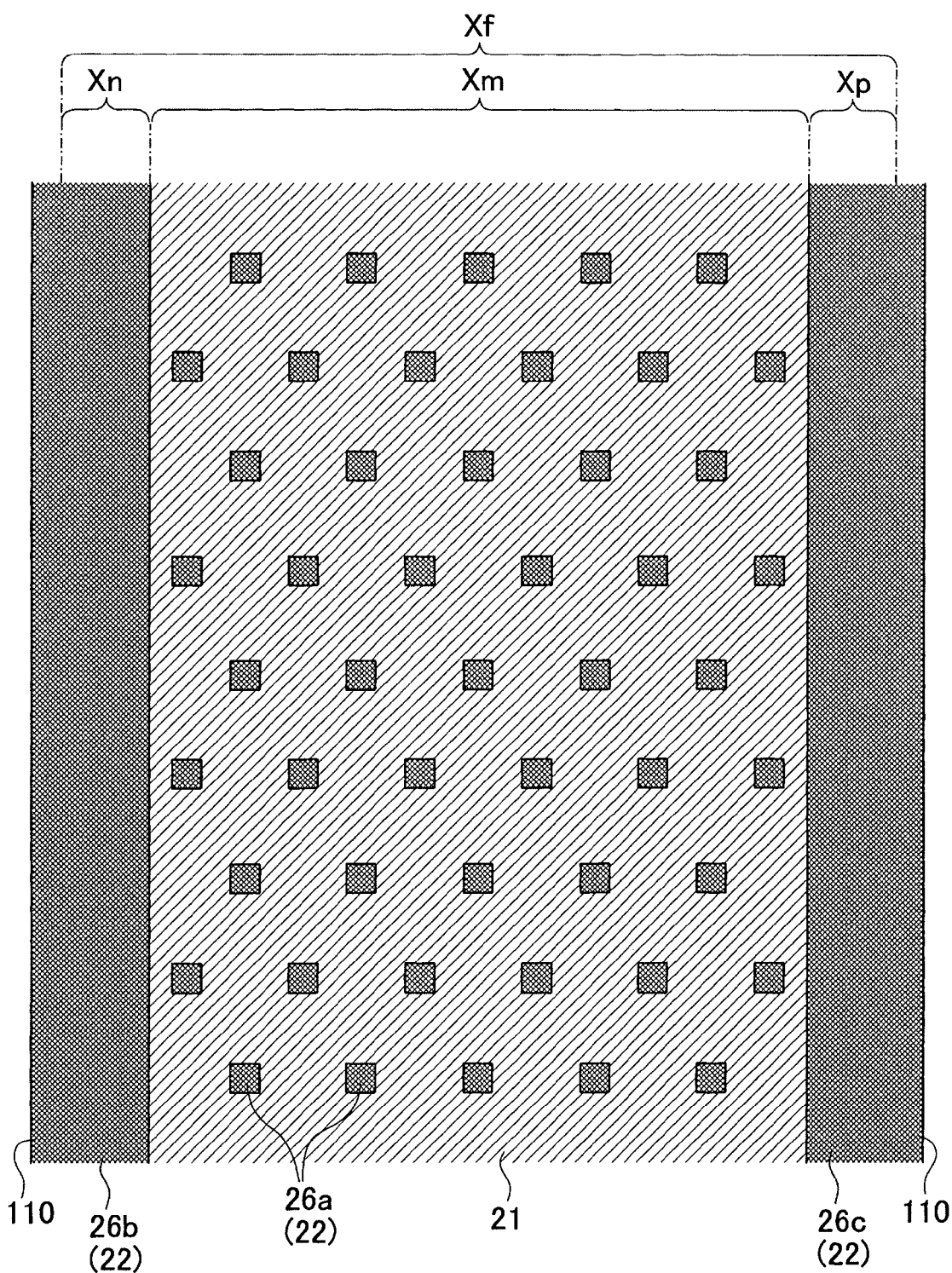
FIG. 10 is a diagram illustrating a back side view of a portion of a semiconductor device according to a third modification of the first embodiment.

A third modification of the first embodiment is described below with reference to FIG. 10. FIG. 10 corresponds to FIG. 5 and illustrates the surface portion of the back surface side of the FWD region Xf.

As shown in FIG. 10, according to the third modification of the first embodiment, the cathode region 21 is not located in end regions Xn, Xo of the FWD region Xf in the width direction. In other words, only absorption regions 26b, 26c are located in the respective end regions Xn, Xo. Thus, the ratio of the absorption region 22 to the cathode region 21 is maximized in the end portions Xn, Xo. The end regions Xn, Xo are located closer to the IGBT region Xi than a middle region Xm of the FWD region Xf in the width direction. Thus, the ratio of the absorption region 22 to the cathode region 21 is maximized on the near side of the FWD region Xf from the IGBT region Xi.

In the middle region Xm of the FWD region Xf, small absorption regions 26a are arranged in the cathode region 21 in a predetermined pattern such as a zigzag pattern. Thus, the ratio of the absorption region 22 to the cathode region 21 is greater in each of the end regions Xo, Xn than in the middle region Xm. That is, the ratio of the absorption region 22 to the cathode region 21 is greater on the near side of the FWD region Xf from the IGBT region Xi than on the far side of the FWD region Xf from the IGBt region Xi.

Fourth Modification of the First Embodiment

Figure 11A:
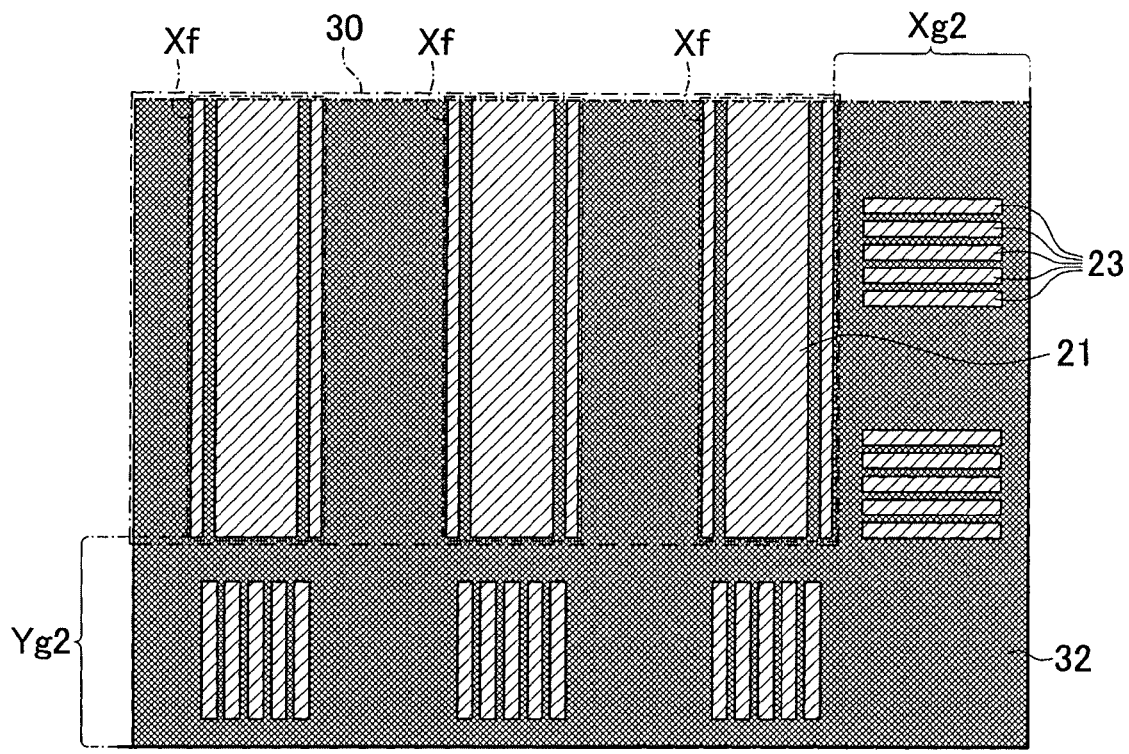
FIG. 11A is a diagram illustrating a back side view of a portion of a semiconductor device according to a fourth modification of the first embodiment.

A fourth modification of the first embodiment is described below with reference to FIG. 11A. FIG. 11A illustrates the surface portion of the back surface side of the FWD region Xf. Specifically, FIG. 11A is an enlarged view of the opposing region 32.

As shown in FIG. 11A, according to the fourth modification of the first embodiment, N-type semiconductor regions 23 are arranged in the opposing region 32 in a predetermined pattern. Specifically, in the regions Xg1, Xg2 of the opposing region 32, the semiconductor regions 23 extend parallel to each other in the width direction. A predetermined number (e.g., five) of the semiconductor regions 23 arranged in the region Xg1, Xg2 are collected to form a group, and the groups are spaced from each other in the length direction. In contrast, in the regions Yg1, Yg2 of the opposing region 32, the semiconductor regions 23 extend parallel to each other in the length direction. A predetermined number (e.g., five) of the semiconductor regions 23 arranged in the region Yg1, Yg2 are collected to form a group, and the groups are spaced from each other in the width direction.

Fifth Modification of the First Embodiment

Figure 11B:
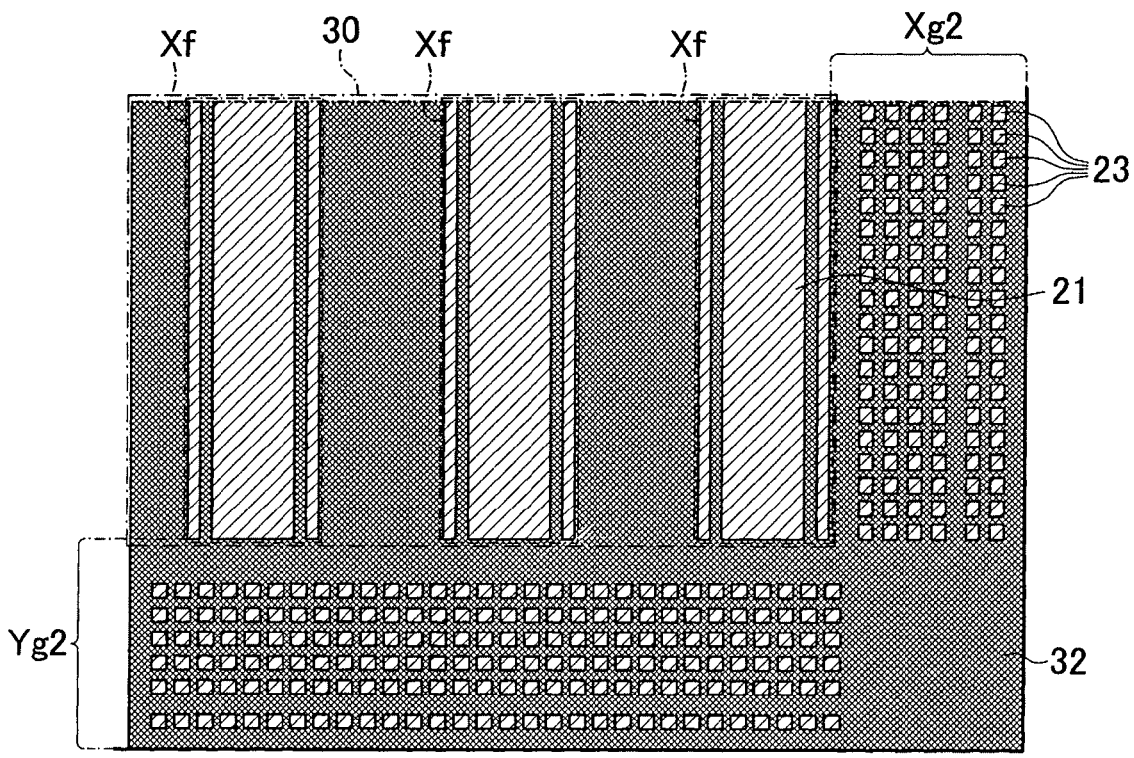
FIG. 11B is a diagram illustrating a back side view of a portion of a semiconductor device according to a fifth modification of the first embodiment.

A fifth modification of the first embodiment is described below with reference to FIG. 11B. FIG. 11B illustrates the surface portion of the back surface side of the FWD region Xf. Specifically, FIG. 11B is an enlarged view of the opposing region 32.

As shown in FIG. 11A, according to the fifth modification of the first embodiment, the N-type semiconductor regions 23 are arranged in the opposing region 32 in a predetermined pattern. Specifically, each of the semiconductor regions 23 has a predetermined small size and a predetermined shape. The semiconductor regions 23 are arranged almost all over the ring-shaped opposing region 32.

Sixth Modification of the First Embodiment

Figure 12:
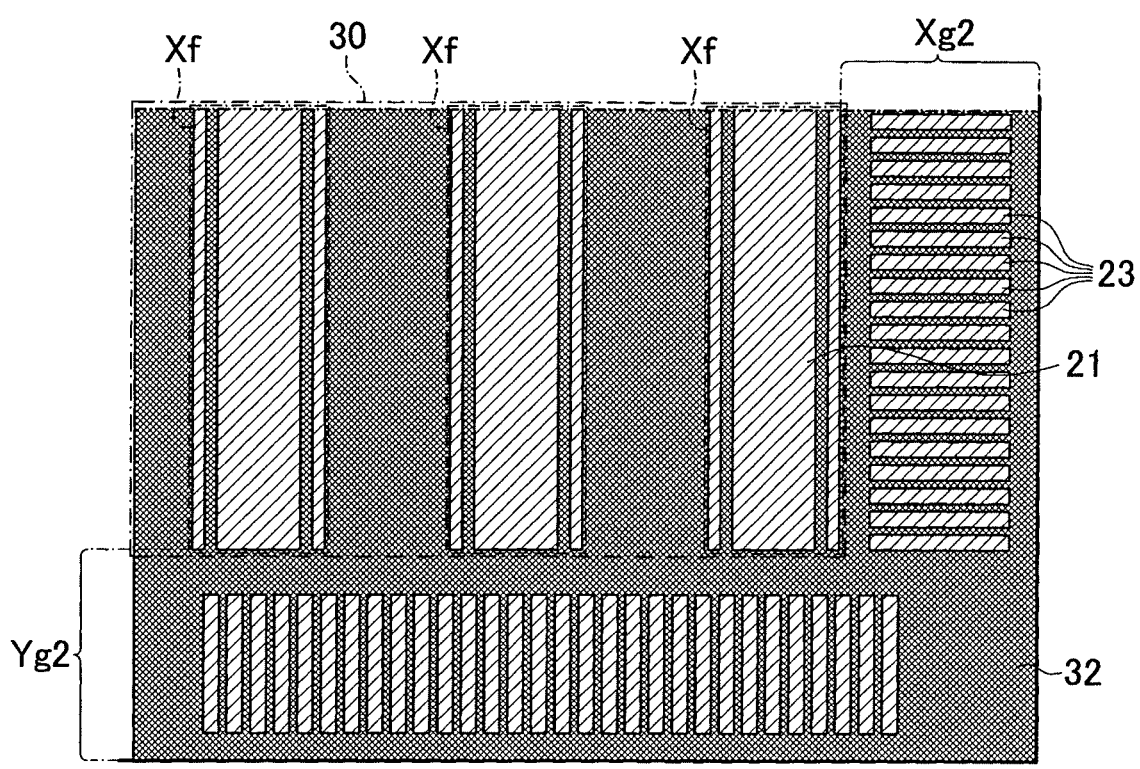
FIG. 12 is a diagram illustrating a back side view of a portion of a semiconductor device according to a sixth modification of the first embodiment.

A sixth modification of the first embodiment is described below with reference to FIG. 12. FIG. 12 illustrates the surface portion of the back surface side of the FWD region Xf. Specifically, FIG. 12 is an enlarged view of the opposing region 32.

As shown in FIG. 12, according to the sixth modification of the first embodiment, the N-type semiconductor regions 23 are arranged in the opposing region 32 in a predetermined pattern. Specifically, in the regions Xg1, Xg2 of the opposing region 32, the semiconductor regions 23 extend parallel to each other in the width direction and are spaced from each other in the length direction. In contrast, in the regions Yg1, Yg2 of the opposing region 32, the semiconductor regions 23 extend parallel to each other in the length direction and are spaced from each other in the width direction. As can be seen from FIG. 12, the semiconductor regions 23 are arranged almost all over the ring-shaped opposing region 32.

Second Embodiment

Figure 13:
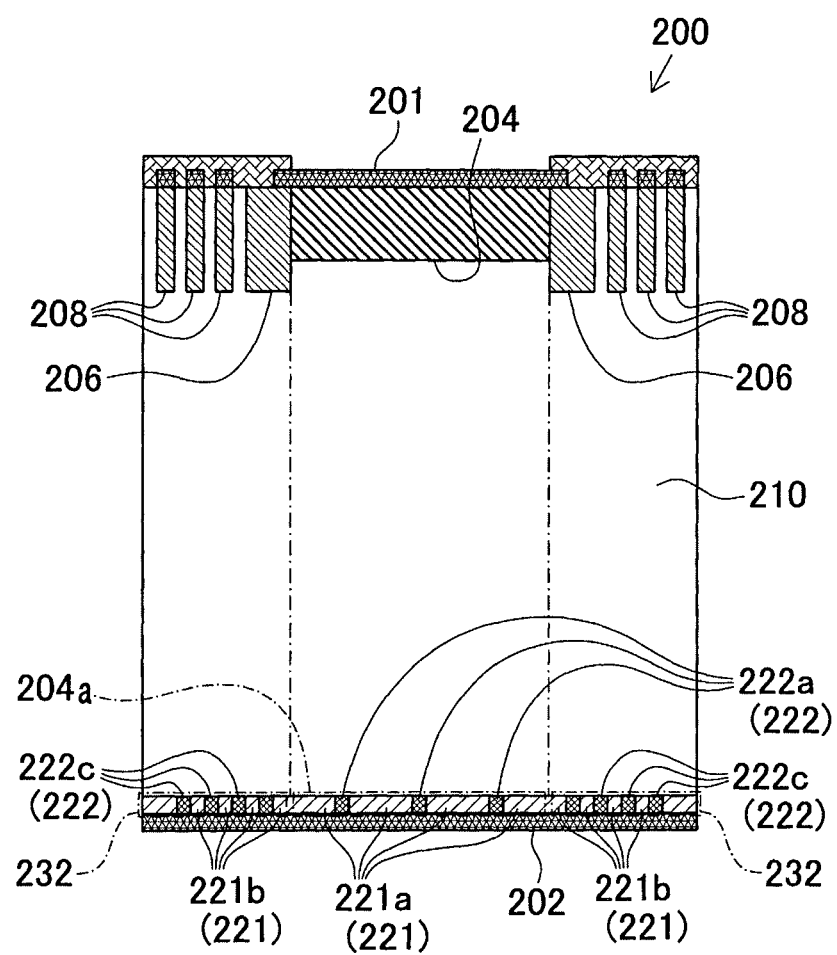
FIG. 13 is a diagram illustrating a cross-sectional view of a semiconductor device according to a second embodiment of the present invention.
Figure 14:
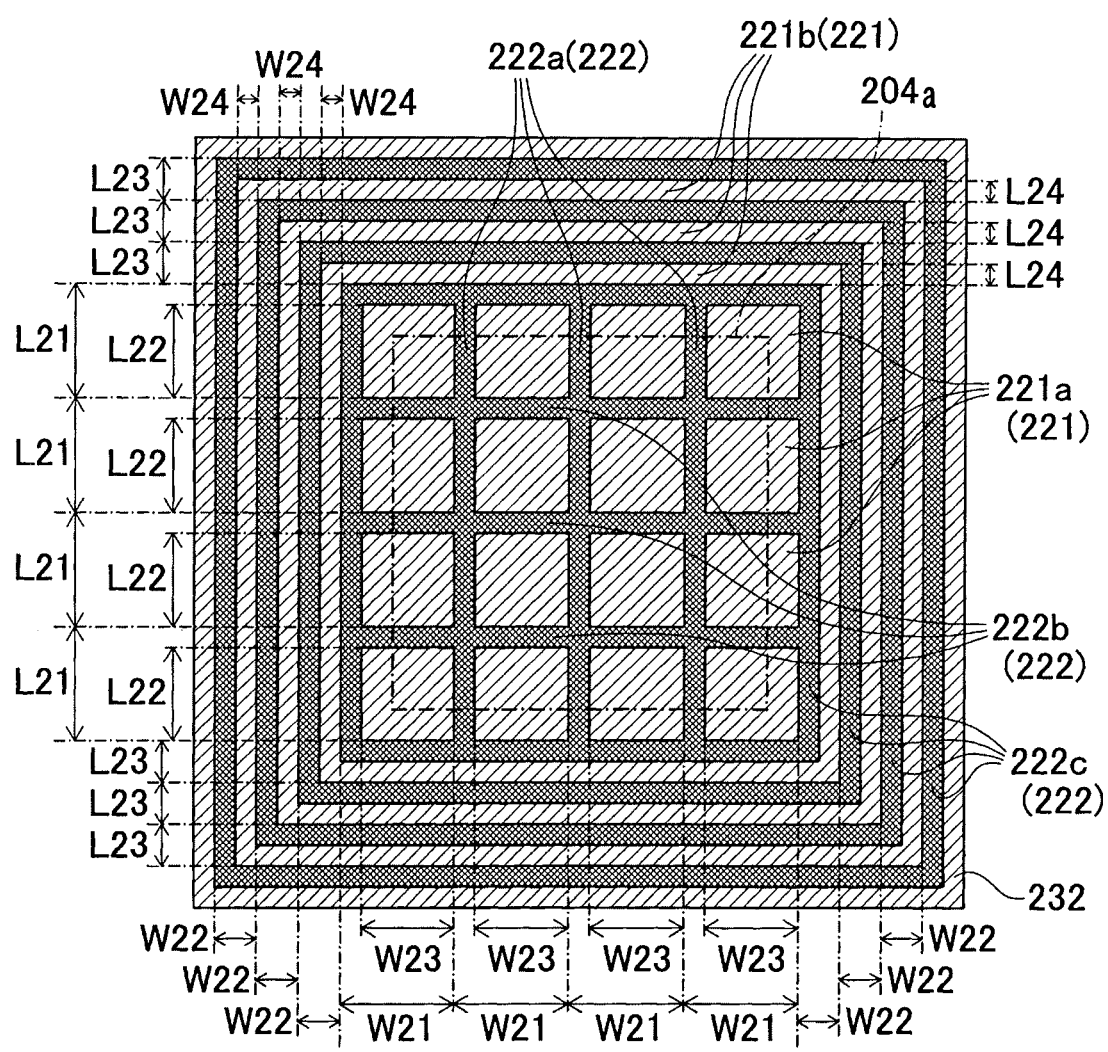
FIG. 14 is a diagram illustrating a back side view of the semiconductor device according to the second embodiment.

A semiconductor device 200 according to a second embodiment of the present invention is described below with reference to FIGS. 13 and 14. FIG. 13 is diagram illustrating a cross-sectional view of the semiconductor device 200. FIG. 14 is a diagram illustrating a back side view of the semiconductor device 200. It is noted that a cathode electrode 202 is omitted in FIG. 14 for the sake of simplicity.

The semiconductor device 200 is configured as a diode. An anode electrode (i.e., first electrode) 201 is formed on a front surface side of an $N^-$-type semiconductor substrate 210 such as a silicon substrate. A cathode electrode (i.e., second electrode) 201 is formed on a back surface side of the semiconductor substrate 210. Specifically, the anode electrode 201 is connected to an anode region (i.e., first semiconductor region) 204, which is described later. The cathode electrode 202 is connected to a cathode region constructed with a cathode-side $N^+$-type layer 221 and an N-type region of the semiconductor substrate 210.

P⁻-type (i.e., first conductivity type) impurities are implanted into the front surface side of the semiconductor substrate 210 so that the anode region 204 can be formed. The anode region 204 has a predetermined planar shape such as a rectangle or a circle. The anode region 204 has a predetermined depth from the front surface of the semiconductor substrate 210.

A P⁺-type well region 206 is formed adjacent to the anode region 204 so that the anode region 204 can be surrounded by the well region 206. P⁺-type impurities are implanted into the front surface side of the semiconductor substrate 210 so that the well region 206 can be formed. An impurity concentration of the well region 206 is higher than an impurity concentration of the anode region 204. A depth of the well region 206 from the front surface of the semiconductor substrate 210 is greater than the depth of the anode region 204.

Further, a P⁺-type (first conductivity type) guard ring 208 is formed on the front surface side of the semiconductor substrate 210 around the anode region 204. The guard ring 208 has a predetermined depth from the front surface of the semiconductor substrate 210 and has a ring shape to surround the anode region 204. Specifically, the well region 206, which surrounds the anode region 204, is surrounded with the guard ring 208. For example, the guard ring 208 can have a multiple-ring structure. An impurity concentration of the guard ring 208 is higher than the impurity concentration of the anode region 204. An electrode is connected to one end of the guard ring 208.

The cathode-side N⁺-type layer 221 is formed on the back surface side of the semiconductor substrate 210 and located adjacent to the N-type region of the semiconductor substrate 210. N-type impurities are implanted into the back surface side of the semiconductor substrate 210 so that the cathode-side N⁺-type layer 221 can be formed. An impurity concentration of the cathode-side N⁺-type layer 221 is higher than an impurity concentration of the N-type region of the semiconductor substrate 210.

A second semiconductor region of N-type is constructed with the cathode-side N⁺-type layer 221 and the N-type region of the semiconductor substrate 210. A P⁺-type (i.e., first conductivity type) absorption region 222 is formed in the second semiconductor region. P-type impurities are implanted into the second semiconductor region so that the absorption region 222 can be formed. For example, the absorption region 222 can have the same depth as the cathode-side N⁺-type layer 221 from the back surface of the semiconductor substrate 210. An impurity concentration of the absorption region 222 is higher than the impurity concentration of the anode region 204.

On the back surface side of the semiconductor substrate 210, the ratio of the absorption region 222 to the cathode-side N⁺-type layer 221 (i.e., second semiconductor region) is greater in an opposing region 232 facing the guard ring 208 than in an anode opposing region 204a facing the anode region 204. That is, the opposing region 232 is a region around the anode opposing region 204a. In other words, the anode opposing region 204a overlaps the anode region 204 in the thickness direction of the semiconductor device 200, and the opposing region 232 does not overlap the anode region 204 in the thickness direction of the semiconductor device 200.

More specifically, as shown in FIG. 14, the cathode-side N⁺-type layer 221 includes rectangular cathode-side N⁺-type layers 221a and rectangular ring-shaped cathode-side N⁺-type layers 221b. The rectangular cathode-side N⁺-type layers 221a are arranged in the center of the surface portion of the second side of the semiconductor substrate 210. The rectangular cathode-side N⁺-type layers 221 are arranged at an interval W21 in the width direction and arranged at an interval L21 in the length direction. In an example shown in FIG. 14, the rectangular cathode-side N⁺-type layers 221 are arranged in a matrix of four rows and four columns. The ring-shaped cathode-side N⁺-type layers 221b are arranged one inside the other around the matrix of the rectangular cathode-side N⁺-type layers 221.

The absorption region 222 includes vertical absorption regions 222a and horizontal absorption regions 222b. Each vertical absorption region 222a extends in the length direction between adjacent rectangular cathode-side N⁺-type layers 221a. Each horizontal absorption region 222b extends in the width direction between adjacent rectangular cathode-side N⁺-type layers 221a. A width of the vertical absorption region 222a is equal to a width of the horizontal absorption region 222b. A width W23 of the rectangular cathode-side N⁺-type layers 221a is larger than the width of the vertical absorption region 222a. For example, the width W23 of the rectangular cathode-side N⁺-type layers 221a can be five times larger than the width of the vertical absorption region 222a. A width L23 of the rectangular cathode-side N⁺-type layers 221a is larger than the width of the horizontal absorption region 222b. For example, the width L23 of the rectangular cathode-side N⁺-type layers 221a can be five times larger than the width of the horizontal absorption region 222b.

The absorption region 222 further includes rectangular ring-shaped absorption regions 222c. The ring-shaped absorption regions 222c are arranged one inside the other around the matrix of the rectangular cathode-side N⁺-type layers 221. The ring-shaped absorption regions 222c are located between the ring-shaped cathode-side N⁺-type layers 221b. Thus, the ring-shaped absorption regions 222c are alternately arranged with the ring-shaped cathode-side N⁺-type layers 221b. A width of the ring-shaped absorption regions 222c is equal to a width L24 of the ring-shaped cathode-side N⁺-type layer 221b. Further, the width of the ring-shaped absorption regions 222c is equal to the width of each of the absorption regions 222a, 222b. Thus, on each side of the matrix of the rectangular cathode-side N⁺-type layers 221 in the width direction, the cathode-side N⁺-type layers 221b are arranged at an interval W22 less than the interval W21 at which the rectangular cathode-side N⁺-type layers 221a are arranged. Further, on each side of the matrix of the rectangular cathode-side N⁺-type layers 221 in the length direction, the cathode-side N⁺-type layers 221b are arranged at an interval L23 less than the interval L21 at which the rectangular cathode-side N⁺-type layers 221a are arranged.

As shown in FIG. 14, the anode opposing region 204a is a region where the matrix of the rectangular cathode-side N⁺-type layers 221 is located. In the anode opposing region 20, the rectangular cathode-side N⁺-type layers 221, each of which has the width L23 in the width direction and the width L22 in the length direction, are arranged at the interval W21 in the width direction and at the interval L21 in the length direction. Therefore, the ratio of the absorption region 222 to the cathode-side N⁺-type layer 221 is relatively small in the anode opposing region 204a. In contrast, in the opposing region 232 around the anode opposing region 204a, the cathode-side N⁺-type layers 221b, each of which has the same width has the absorption region 222c, are arranged at the interval W22 less than the interval W21 on each side of the anode opposing region 204a in the width direction and arranged at the interval L23 less than the interval L21 on each side of the anode opposing region 204a in the length direction. Therefore, the ratio of the absorption region 222 to the cathode-side N$^+$-type layer 221 is greater in the opposing region 232 than in the anode opposing region 204a.

The present inventors have conducted a simulation to evaluate a relationship between a ratio Wn/Lh, a forward voltage Vf, and a switching loss Err at the time of reverse recovery action of the semiconductor device 200 according to the second embodiment. The ratio Wn/Lh represents a ratio of a cathode-side N$^+$-type layer width Wn to a hole (i.e., minority carrier) diffusion length Lh. The simulation has been conducted under conditions that Wn=W23=L22, and Lh=sqrt (DhXTh)≈28 μm. Dh represents a diffusion coefficient, and Dh=kTμh/q. k represents a Boltzmann coefficient, and k=1.38×10$^{-23}$ J/K. T represents an absolute temperature, and T=300K. μh represents a mobility, and μh=500 cm$^2$/V/s. Th represents a lifetime, and Th=0.6 μs (at the time of electron irradiation). q represents a charge of an electron, and q=1.6×10$^{-19}$ C.

Figure 15:
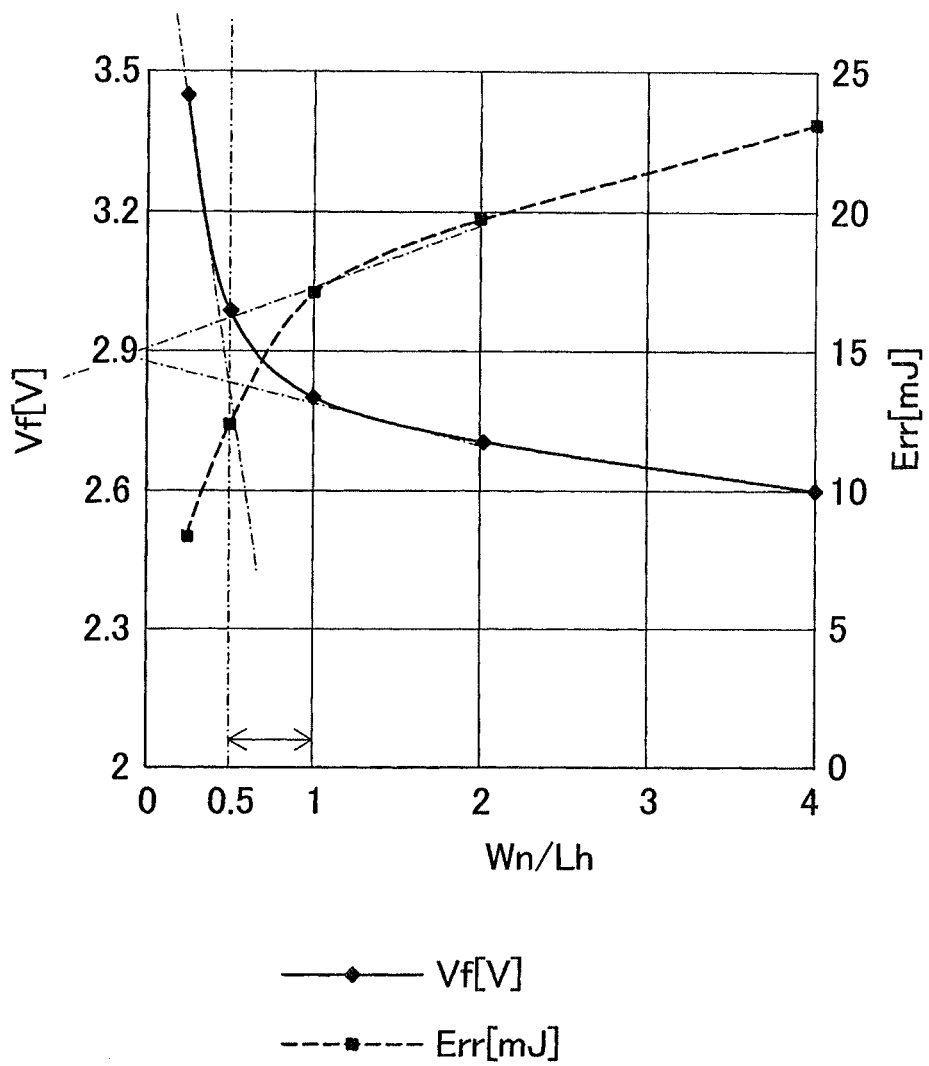
FIG. 15 is a diagram illustrating a result of a simulation conducted to evaluate a relationship between a ratio Wn/Lh, a forward voltage Vf, and a switching loss Err of the semiconductor device according to the second embodiment.
Figure 16A:
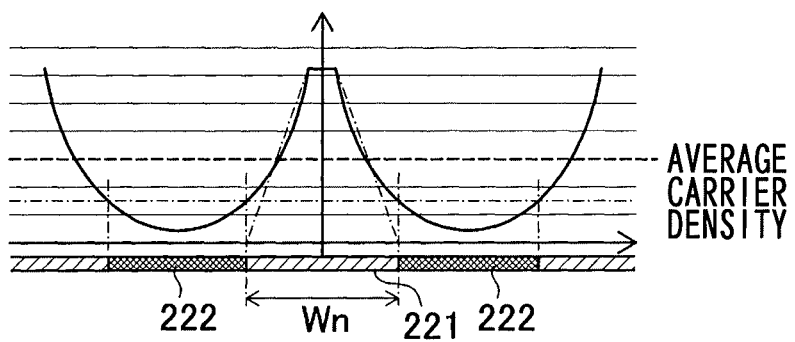
FIGS. 16A-16C illustrate a relationship between a cathode region width and an average carrier density.
Figure 16B:
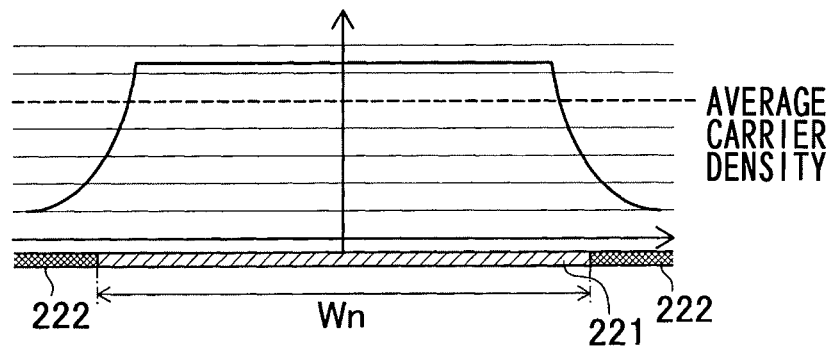
Figure 16C:
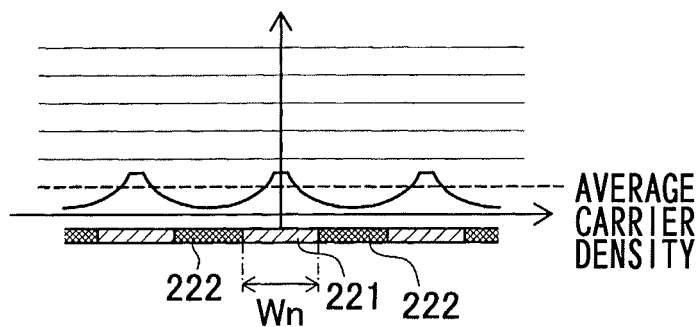

FIG. 15 illustrates a result of the simulation. In FIG. 15, a solid line represents a relationship between the ratio Wn/Lh and the forward voltage Vf, and a broken line represents a relationship between the ratio Wn/Lh and the switching loss Err. FIGS. 16A-16C illustrate a relationship between the cathode-side N$^+$-type layer width Wn and an average carrier density. FIG. 16A shows a case where the width Wn is almost equal to the hole diffusion length Lh. FIG. 16B shows a case where the width Wn is much longer than the hole diffusion length Lh. FIG. 16C shows a case where the width Wn is much shorter than the hole diffusion length Lh.

As can be seen from FIG. 15, when the ratio Wn/Lh is more than 1.0, the switching loss greatly increases. A reason for this is that the average carrier density becomes large near the cathode-side N$^+$-type layer 221 as shown in FIG. 16B, i.e., the holes are excessively accumulated near the cathode-side N$^+$-type layer 221. Therefore, it is preferable that the ratio Wn/Lh be 1.0 or less.

Further, as can be seen from FIG. 15, when the ratio Wn/Lh is less than 0.5, the forward voltage Vf greatly increases. A reason for this is that the average carrier density becomes very low as shown in FIG. 16C. Therefore, it is preferable that the ratio Wn/Lh be 0.5 or more.

For the above reasons, it is preferable that the ratio Wn/Lh be in the range from 0.5 to 1.0 (i.e., 0.5≤Wn/Lh≤1.0). In such an approach, the average carrier density is kept at a suitable value so that both the forward voltage Vf and the switching loss Err can be reduced. Further, it is preferable that the widths of the absorption regions 222a, 222b, and 222c be small as much as possible. For example, the widths of the absorption regions 222a, 222b, and 222c can be almost equal to a resolution (e.g., in a range from 0.5 μm to 10 μm) of an exposure apparatus used for manufacturing the semiconductor device 200.

Advantages of the second embodiment are summarized below.

According to the second embodiment, the guard ring 208 of P-type (i.e., first conductivity type) is formed on the front surface side of the semiconductor substrate 210 around the anode region 204 (i.e., first semiconductor region). In such an approach, a voltage breakdown resistance around the anode region 204 can be improved effectively.

Further, according to the second embodiment, the absorption region 222 of P-type (i.e., first conductivity type) is formed in the second semiconductor region of N-type on the back surface side of the semiconductor substrate 210 in such a manner that the ratio of the absorption region 222 to the cathode-side N$^+$-type layer 221 is greater in the opposing region 232 facing the ring guard 208 than in the anode opposing region 204a facing the anode region 204. In such an approach, holes (i.e., minority carriers) injected from the guard ring 208 are electively absorbed by the absorption region 222 in the opposing region 232. Thus, a reduction in a recovery capability due to excessive accumulation of minority carriers can be effectively reduced.

First Modification of the Second Embodiment

Figure 17:
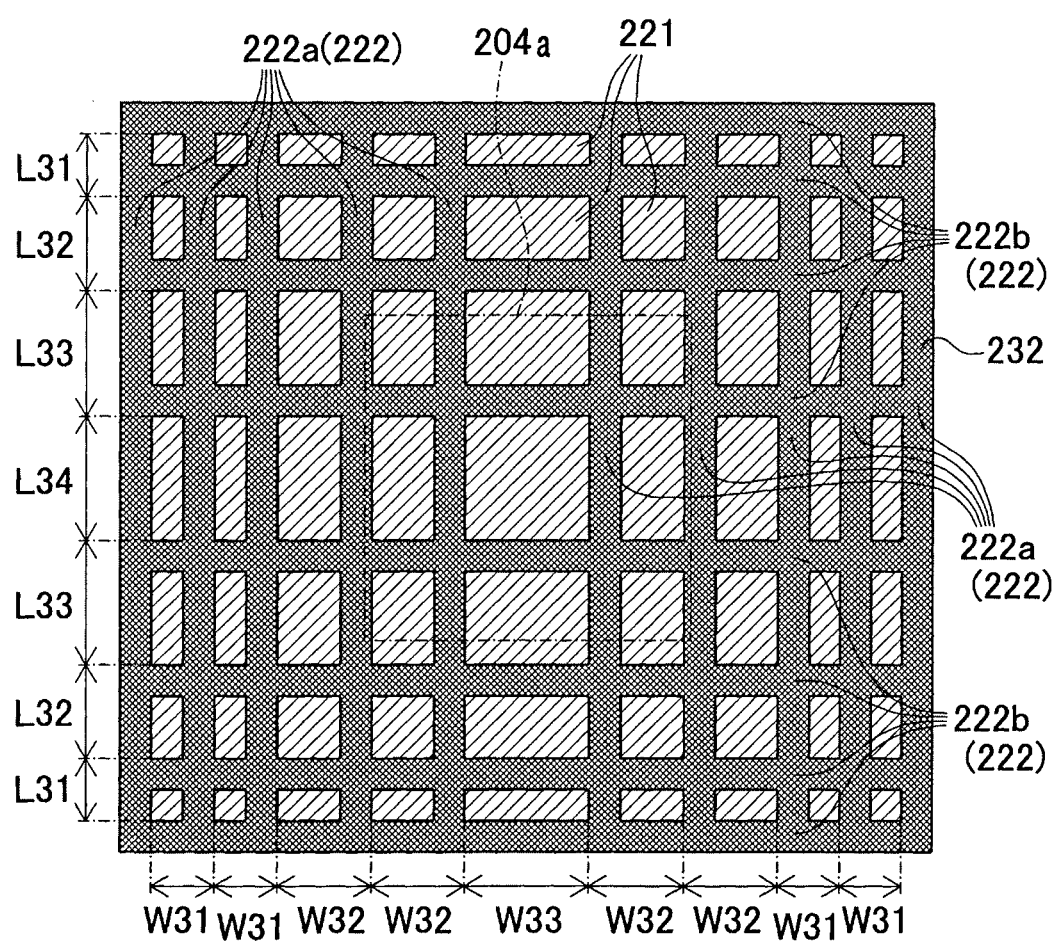
FIG. 17 is a diagram illustrating a back side view of a semiconductor device according to a first modification of the second embodiment.

A first modification of the second embodiment is described below with reference to FIG. 17. FIG. 17 corresponds to FIG. 14 and illustrates the surface portion of the back surface side of the semiconductor substrate 210.

As shown in FIG. 17, according to the first modification of the second embodiment, the cathode-side N$^+$-type layers 221 are arranged in a matrix of nine rows and nine columns. The anode opposing region 204a is located in the center portion of the matrix. A width of the cathode-side N$^+$-type layer 221 in the length direction decreases with a distance from the center of the matrix. Likewise, a width of the cathode-side N$^+$-type layer 221 in the width direction decreases with a distance from the center of the matrix.

Specifically, the cathode-side N$^+$-type layer 221 in the center column has a width W33 in the width direction. The cathode-side N$^+$-type layer 221 in two columns next to the center column has a width W32 less than the width W33 in the width direction. The cathode-side N$^+$-type layer 221 in two columns next to the two columns next to the center column has a width W31 less than the width W32 in the width direction. In this way, the width of the cathode-side N$^+$-type layer 221 in the width direction decreases with the distance from the center of the matrix.

Likewise, the cathode-side N$^+$-type layer 221 in the center row has a width L34 in the length direction. The cathode-side N$^+$-type layer 221 in a row next to the center row has a width L33 less than the width L34. The cathode-side N$^+$-type layer 221 in a row next to the row next to the center row has a width L32 less than the width L33. The cathode-side N$^+$-type layer 221 in a row next to the row next to the row next to the center row has a width L31 less than the width L32. In this way, the width of the cathode-side N$^+$-type layer 221 in the length direction decreases with the distance from the center of the matrix.

The absorption region 222 includes the vertical absorption regions 222a and the horizontal absorption regions 222b. The vertical absorption region 222a extends in the length direction between adjacent cathode-side N$^+$-type layers 221. The horizontal absorption region 222b extends in the width direction between adjacent cathode-side N$^+$-type layers 221. Further, the outermost vertical absorption regions 222a and the horizontal absorption regions 222b are joined to form a rectangular ring-shaped absorption region with which the matrix of the cathode-side N$^+$-type layers 221 is surrounded. The width of the vertical absorption region 222a is equal to the width of the horizontal absorption region 222b.

As can be seen from FIG. 17, the ratio of the absorption region 222 to the cathode-side N$^+$-type layer 221 is greater in the opposing region 232 facing the ring guard 208 than in the anode opposing region 204a facing the anode region 204. In such an approach, holes (i.e., minority carriers) injected from the guard ring 208 are electively absorbed by the absorption region 222 in the opposing region 232. Thus, a reduction in a recovery capability due to excessive accumulation of minority carriers can be effectively reduced.

Second Modification of the Second Embodiment

Figure 18A:
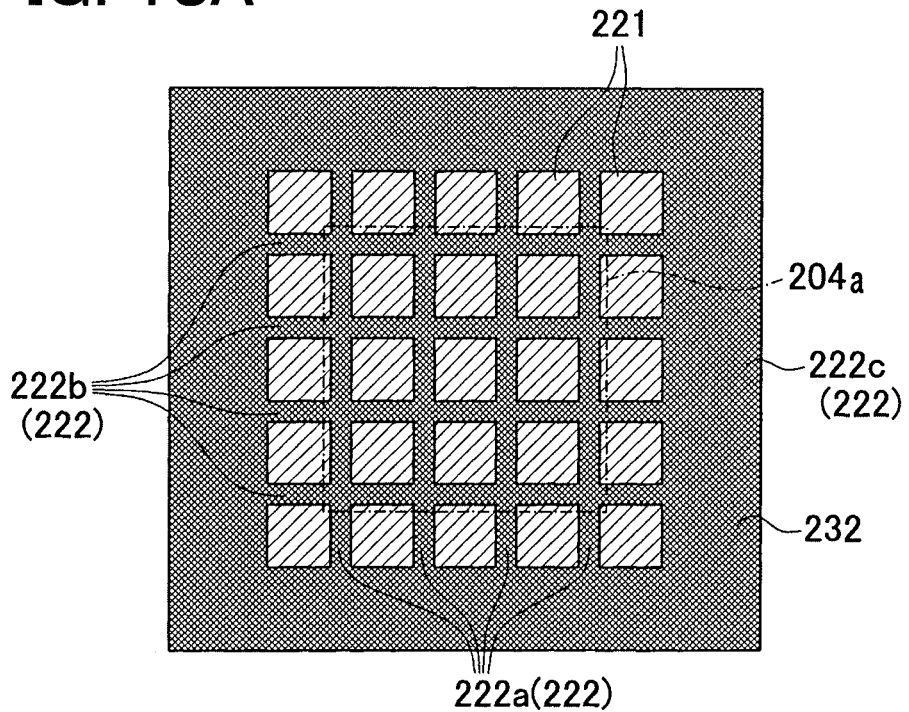
FIG. 18A is a diagram illustrating a back side view of a semiconductor device according to a second modification of the second embodiment.

A second modification of the second embodiment is described below with reference to FIG. 18A. FIG. 18A corresponds to FIG. 14 and illustrates the surface portion of the back surface side of the semiconductor substrate 210.

As shown in FIG. 18A, according to the second modification of the second embodiment, the cathode-side $N^+$-type layers 221 are arranged in a matrix of five rows and five columns. The cathode-side $N^+$-type layers 221 are collected near the anode opposing region 204a.

The absorption region 222 includes the vertical absorption regions 222a, the horizontal absorption regions 222b, and the ring-shaped absorption region 222c. The vertical absorption region 222a extends in the length direction between adjacent cathode-side $N^+$-type layers 221. The horizontal absorption region 222b extends in the width direction between adjacent cathode-side $N^+$-type layers 221. The ring-shaped absorption region 222c surrounds the matrix of the cathode-side $N^+$-type layers 221 so that the anode opposing region 204a can be surrounded with the ring-shaped absorption region 222c. That is, the ring-shaped absorption region 222c is located in the opposing region 232. The width of the vertical absorption region 222a is equal to the width of the horizontal absorption region 222b.

As can be seen from FIG. 18A, the ratio of the absorption region 222 to the cathode-side $N^+$-type layer 221 is greater in the opposing region 232 facing the ring guard 208 than in the anode opposing region 204a facing the anode region 204. In such an approach, holes (i.e., minority carriers) injected from the guard ring 208 are electively absorbed by the absorption region 222 in the opposing region 232. Thus, a reduction in a recovery capability due to excessive accumulation of minority carriers can be effectively reduced.

Third Modification of the Second Embodiment

Figure 18B:
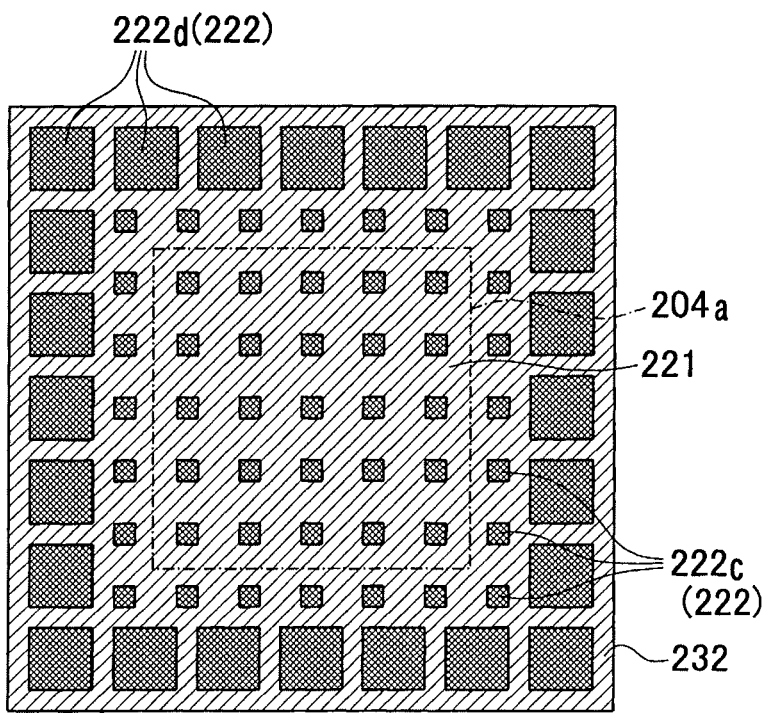
FIG. 18B is a diagram illustrating a back side view of a semiconductor device according to a third modification of the second embodiment.

A third modification of the second embodiment is described below with reference to FIG. 18B. FIG. 18B corresponds to FIG. 14 and illustrates the surface portion of the back surface side of the semiconductor substrate 210.

As shown in FIG. 18B, according to the third modification of the second embodiment, P-type absorption regions 222c having small sizes are arranged in a matrix of seven rows and seven columns near the anode opposing region 204a. Further, P-type absorption regions 222d having large sizes are arranged in a ring around the matrix of the absorption regions 222c. That is, the absorption regions 222d are located in the opposing region 232. The cathode-side $N^+$-type layer 221 is located between the absorption regions 222c and the absorption regions 222d.

The size of the absorption region 222c is smaller than the size of the absorption region 222d. Further, an interval between adjacent absorption regions 222c is larger than an interval between absorption regions 222d. Therefore, the ratio of the absorption region 222 to the cathode-side $N^+$-type layer 221 is greater in the opposing region 232 facing the ring guard 208 than in the anode opposing region 204a facing the anode region 204. In such an approach, holes (i.e., minority carriers) injected from the guard ring 208 are electively absorbed by the absorption region 222 in the opposing region 232. Thus, a reduction in a recovery capability due to excessive accumulation of minority carriers can be effectively reduced.

Third Embodiment

Figure 19A:
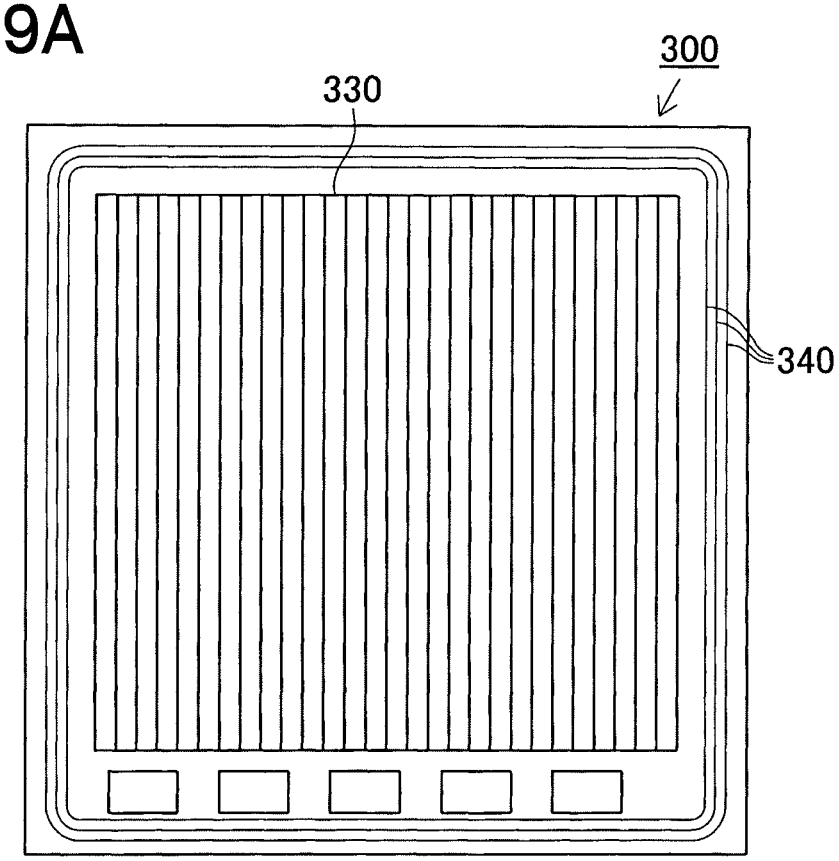
FIG. 19A is a diagram illustrating a front side view of a semiconductor device according to a third embodiment of the present invention.

A semiconductor device 300 according to a third embodiment of the present invention is described below with reference to FIGS. 19A, 19B, and 20A. FIG. 19A is diagram illustrating a front side view of the semiconductor device 300.

Figure 19B:
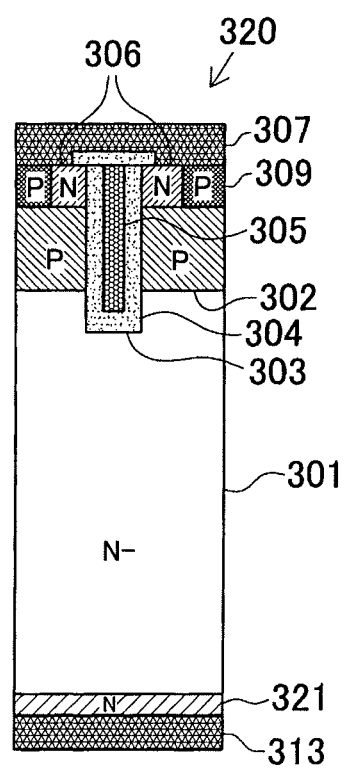
FIG. 19B is a diagram illustrating a cross-sectional view of a semiconductor element of the semiconductor device according to the third embodiment.

FIG. 19B is a diagram illustrating a partial cross-sectional view of FIG. 19A taken along a line extending in the width direction. FIG. 20A is a diagram illustrating a back side view of the semiconductor device 300.

As shown in FIG. 19A, the semiconductor device 300 has a rectangular planar shape. The semiconductor device 300 is configured as a double-diffused MOS (DMOS) transistor. The semiconductor device 300 includes an $N^-$-type semiconductor substrate 301 such as a silicon substrate. The semiconductor substrate 301 has a front surface and a back surface opposite to the front surface. Multiple DMOS elements 320 are arranged in an element region 330 of the semiconductor substrate 301. The element region 330 is located in a center portion of the semiconductor substrate 301. P-type base region 302 is selectively formed on the front surface side of the semiconductor substrate 301.

The base region 302 serves as a channel region of the DMOS element 320. As shown in FIG. 19B, a trench 303 is selectively formed in the base region 302. The trench 303 penetrates the base region 302 and reaches the semiconductor substrate 301. Thus, a bottom of the trench 303 is located in the semiconductor substrate 301. The trench 303 is formed in a predetermined position in the width direction of the semiconductor device 300 and extends in the length direction of the semiconductor device 300. The width direction and the length direction of the semiconductor device 300 are perpendicular to each other.

A gate insulation layer 304 is formed on an inner surface of the trench 303. The gate electrode 305 is formed on the gate insulation layer 304 so that the trench 303 can be filled with the gate insulation layer 304 and the gate electrode 305. For example, the gate insulation layer 304 can be an oxide layer, and the gate electrode 305 can be polysilicon.

An $N^+$-type source region 306 (i.e., first semiconductor region) is selectively formed in the base region 302 and located adjacent to a side wall of the trench 303. The source region 306 is electrically connected to a source electrode (i.e., first electrode) 307. For example, the source electrode 307 can be made of an aluminum-based material. Further, a $P^+$-type body region 309 is selectively formed in a surface portion of the base region 302. The body region 309 is located adjacent to the source region 306.

An $N^+$-type drain region (second semiconductor region) 321 is selectively formed in a surface portion of the back surface side of the semiconductor substrate 301. The drain region 321 is electrically connected to a drain electrode (i.e., second electrode) 313. For example, the drain electrode 313 can be made of an aluminum-based material.

Figure 20A:
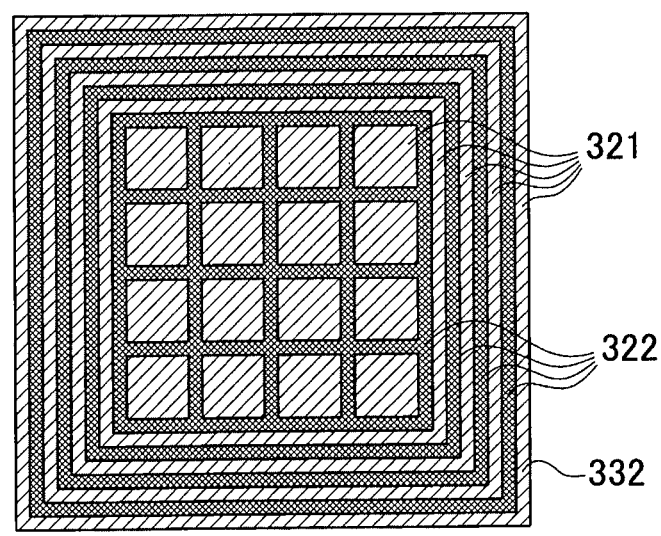
FIG. 20A is a diagram illustrating a back side view of the semiconductor device according to the third embodiment.

As shown in FIG. 20A, a P-type absorption region 322 is formed in the surface portion of the back surface side of the semiconductor substrate 301. The absorption region 322 is located adjacent to the drain region 321.

Further, as shown in FIG. 19A, a $P^+$-type (i.e., first conductivity type) guard ring 340 is formed in the surface portion of the front surface side of the semiconductor substrate 301. The guard ring 340 is located in the outer edge of the semiconductor substrate 301 so that the element region 330 can be surrounded by the guard ring 340. The guard ring 340 has a predetermined depth from the front surface of the semiconductor substrate 301. For example, the guard ring 340 can have a multiple-ring structure.

As can be seen from FIG. 14 and FIG. 20A, the back surface side of the semiconductor device 300 of the third embodiment is the same as the back surface side of the semiconductor device 200 of the second embodiment except that the cathode-side $N^+$-type layer 221 and the absorption region 222 are respectively replaced with the drain region 321 and the absorption region 322. Thus, the drain region 321 (i.e., second semiconductor region) and the absorption region 322 (i.e., first semiconductor region) are formed in the surface portion of the back surface side of the semiconductor substrate 301 in such a manner that the ratio of the absorption region 322 to the drain region 321 is greater in an opposing region 332 facing the guard ring 340 than in an element opposing region facing the element region 330. The opposing region 332 overlaps the guard ring 340 in the thickness direction of the semiconductor device 300. The element opposing region overlaps the element region 330 in the thickness direction of the semiconductor device 300.

First Modification of the Third Embodiment

A first modification of the third embodiment is described below with reference to FIG. 20B. As can be seen from FIG. 17 and FIG. 20B, the back surface side of the semiconductor device 300 of the first modification of the third embodiment is the same as the back surface side of the semiconductor device 200 of the first modification of the second embodiment except that the cathode-side $N^+$-type layer 221 and the absorption region 222 are respectively replaced with the drain region 321 and the absorption region 322. Thus, the drain region 321 and the absorption region 322 are formed in the surface portion of the back surface side of the semiconductor substrate 301 in such a manner that the ratio of the absorption region 322 to the drain region 321 is greater in the opposing region 332 facing the guard ring 340 than in the element opposing region facing the element region 330.

Second Modification of the Third Embodiment

A second modification of the third embodiment is described below with reference to FIG. 21A. As can be seen from FIG. 18A and FIG. 21A, the back surface side of the semiconductor device 300 of the second modification of the third embodiment is the same as the back surface side of the semiconductor device 200 of the second modification of the second embodiment except that the cathode-side $N^+$-type layer 221 and the absorption region 222 are respectively replaced with the drain region 321 and the absorption region 322. Thus, the drain region 321 and the absorption region 322 are formed in the surface portion of the back surface side of the semiconductor substrate 301 in such a manner that the ratio of the absorption region 322 to the drain region 321 is greater in the opposing region 332 facing the guard ring 340 than in the element opposing region facing the element region 330.

Third Modification of the Third Embodiment

A third modification of the third embodiment is described below with reference to FIG. 21B. As can be seen from FIG. 18B and FIG. 21B, the back surface side of the semiconductor device 300 of the third modification of the third embodiment is the same as the back surface side of the semiconductor device 200 of the third modification of the second embodiment except that the cathode-side $N^+$-type layer 221 and the absorption region 222 are respectively replaced with the drain region 321 and the absorption region 322. Thus, the drain region 321 and the absorption region 322 are formed in the surface portion of the back surface side of the semiconductor substrate 301 in such a manner that the ratio of the absorption region 322 to the drain region 321 is greater in the opposing region 332 facing the guard ring 340 than in the element opposing region facing the element region 330.

Fourth Embodiment

Figure 22A:
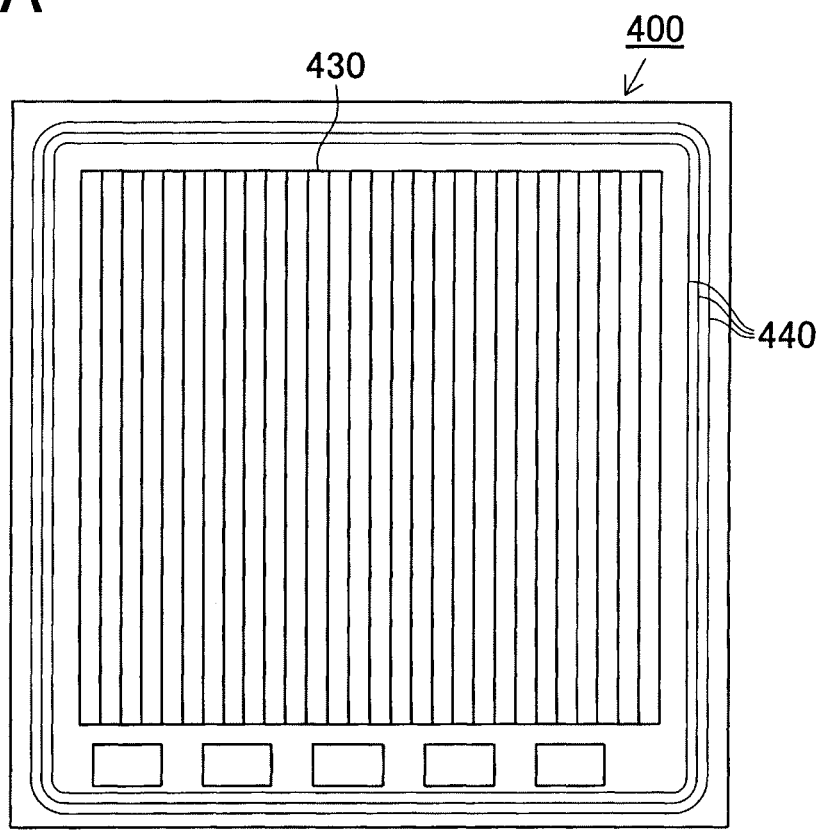
FIG. 22A is a diagram illustrating a front side view of a semiconductor device according to a fourth embodiment of the present invention.
Figure 22B:
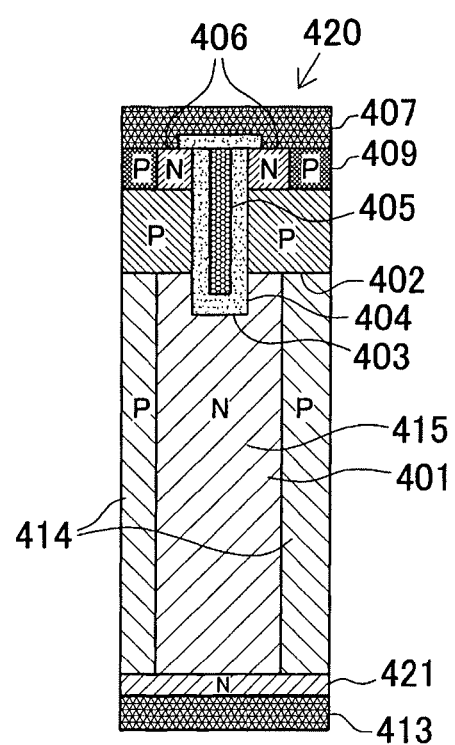
FIG. 22B is a diagram illustrating a cross-sectional view of a semiconductor element of the semiconductor device according to the fourth embodiment.
Figure 23:
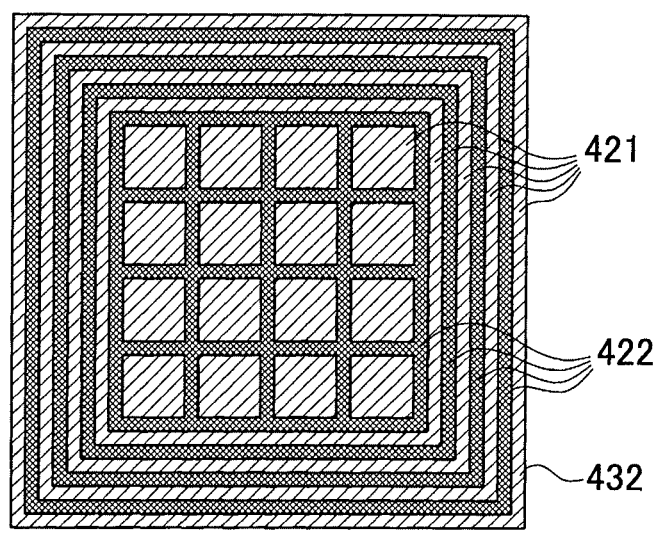
FIG. 23 is a diagram illustrating a back side view of the semiconductor device according to the fourth embodiment.

A semiconductor device 400 according to a fourth embodiment of the present invention is described below with reference to FIGS. 22A, 22B, and 23. FIG. 22A is diagram illustrating a front side view of the semiconductor device 400. FIG. 22B is a diagram illustrating a partial cross-sectional view of FIG. 22A taken along a line extending in the width direction. FIG. 23 is a diagram illustrating a back side view of the semiconductor device 400. A difference of the fourth embodiment from the third embodiment is that the DMOS elements 320 are replaced with super-junction DMOS elements 420.

As shown in FIG. 22A, the semiconductor device 400 has a rectangular planar shape. The semiconductor device 400 includes an IT-type semiconductor substrate 401 such as a silicon substrate. The semiconductor substrate 401 has a front surface and a back surface opposite to the front surface. Multiple super-junction DMOS elements 420 are arranged in an element region 430 of the semiconductor substrate 401. The element region 430 is located in a center portion of the semiconductor substrate 401. P-type base region 402 is selectively formed on the front surface side of the semiconductor substrate 401.

As shown in FIG. 22B, a trench 403 is selectively formed in the base region 402. The trench 403 penetrates the base region 402 and reaches the semiconductor substrate 401. Thus, a bottom of the trench 403 is located in the semiconductor substrate 401. The trench 403 is formed in a predetermined position in the width direction of the semiconductor device 400 and extends in the length direction of the semiconductor device 400. The width direction and the length direction of the semiconductor device 400 are perpendicular to each other.

A gate insulation layer 404 is formed on an inner surface of the trench 403. The gate electrode 405 is formed on the gate insulation layer 404 so that the trench 403 can be filled with the gate insulation layer 404 and the gate electrode 405. For example, the gate insulation layer 404 can be an oxide layer, and the gate electrode 405 can be polysilicon.

An $N^+$-type source region 406 (i.e., first semiconductor region) is selectively formed in the base region 402 and located adjacent to a side wall of the trench 403. The source region 406 is electrically connected to a source electrode (i.e., first electrode) 407. For example, the source electrode 407 can be made of an aluminum-based material. Further, a $P^+$-type body region 409 is selectively formed in a surface portion of the base region 402. The body region 409 is located adjacent to the source region 406.

An $N^+$-type drain region (i.e., second semiconductor region) 421 is selectively formed in a surface portion of the back surface side of the semiconductor substrate 401. The drain region 421 is electrically connected to a drain electrode (i.e., second electrode) 413. For example, the drain electrode 413 can be made of an aluminum-based material.

As shown in FIG. 23, a P-type absorption region 422 is formed in the surface portion of the back surface side of the semiconductor substrate 301. The absorption region 422 is located adjacent to the drain region 421. Further, as shown in FIG. 22B, an N-type pillar region 415 is formed between the base region 402 and the drain region 421 in a center portion of the DMOS element 420 in the width direction. Further, a P-type pillar region 414 is formed on each side of the pillar region 415 in the width direction.

Further, as shown in FIG. 22A, a P$^+$-type (i.e., first conductivity type) guard ring 440 is formed in the surface portion of the front surface side of the semiconductor substrate 401. The guard ring 440 is located in the outer edge of the semiconductor substrate 401 so that the element region 430 can be surrounded by the guard ring 440. The guard ring 440 has a predetermined depth from the front surface of the semiconductor substrate 401. For example, the guard ring 440 can have a multiple-ring structure.

As can be seen from FIG. 14 and FIG. 23, the back surface side of the semiconductor device 400 of the fourth embodiment is the same as the back surface side of the semiconductor device 200 of the second embodiment except that the cathode-side N$^+$-type layer 221 and the absorption region 222 are respectively replaced with the drain region 421 and the absorption region 422. Thus, the drain region 421 (i.e., second semiconductor region) and the absorption region 422 (i.e., first semiconductor region) are formed in the surface portion of the back surface side of the semiconductor substrate 401 in such a manner that the ratio of the absorption region 422 to the drain region 421 is greater in an opposing region 432 facing the guard ring 440 than in an element opposing region facing the element region 430. The opposing region 432 overlaps the guard ring 440 in the thickness direction of the semiconductor device 400. The element opposing region overlaps the element region 430 in the thickness direction of the semiconductor device 400.

Figure 20B:
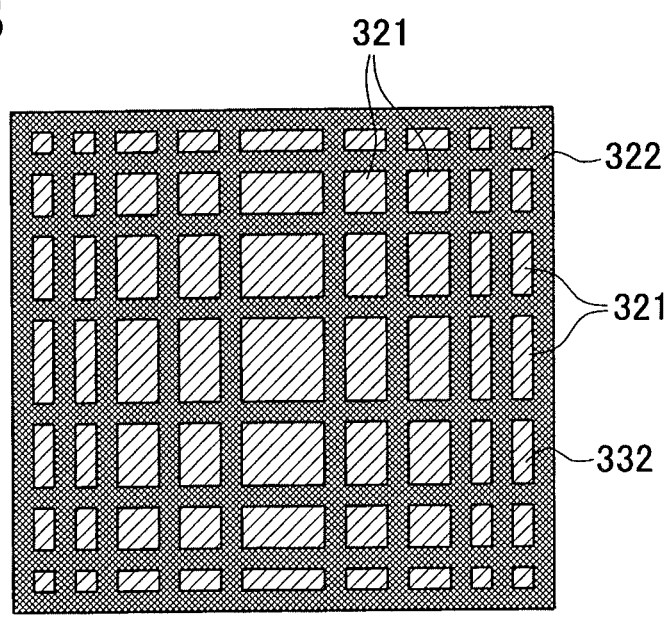
FIG. 20B is a diagram illustrating a back side view of a semiconductor device according to a first modification of the third embodiment.
Figure 21A:
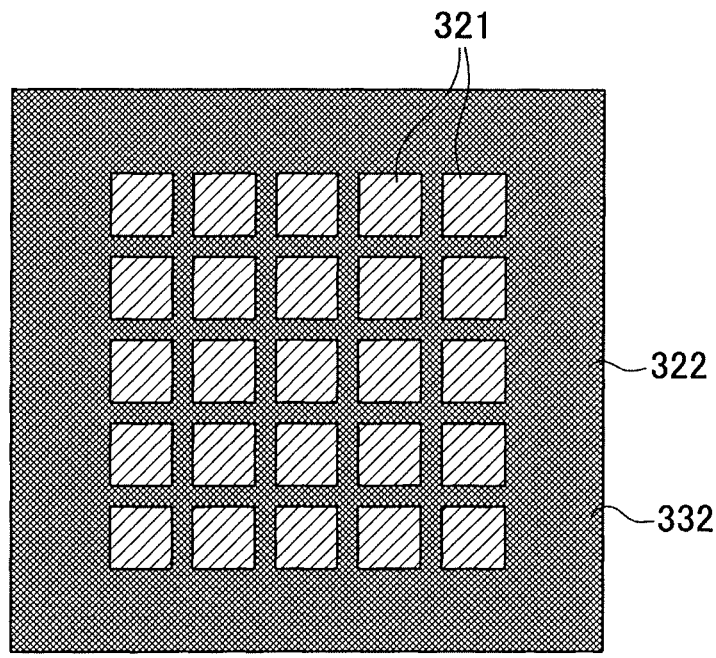
FIG. 21A is a diagram illustrating a back side view of a semiconductor device according to a second modification of the third embodiment.
Figure 21B:
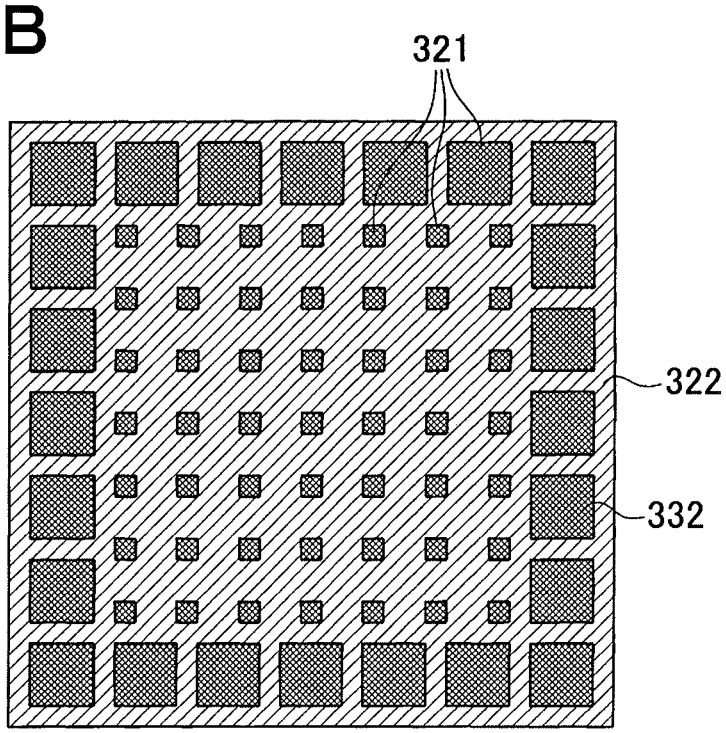
FIG. 21B is a diagram illustrating a back side view of a semiconductor device according to a third modification of the third embodiment.

The back surface side of the semiconductor device 400 of the fourth embodiment can be modified in a manner as shown in FIG. 20B, 21A, or 21B.

Fifth Embodiment

Figure 24:
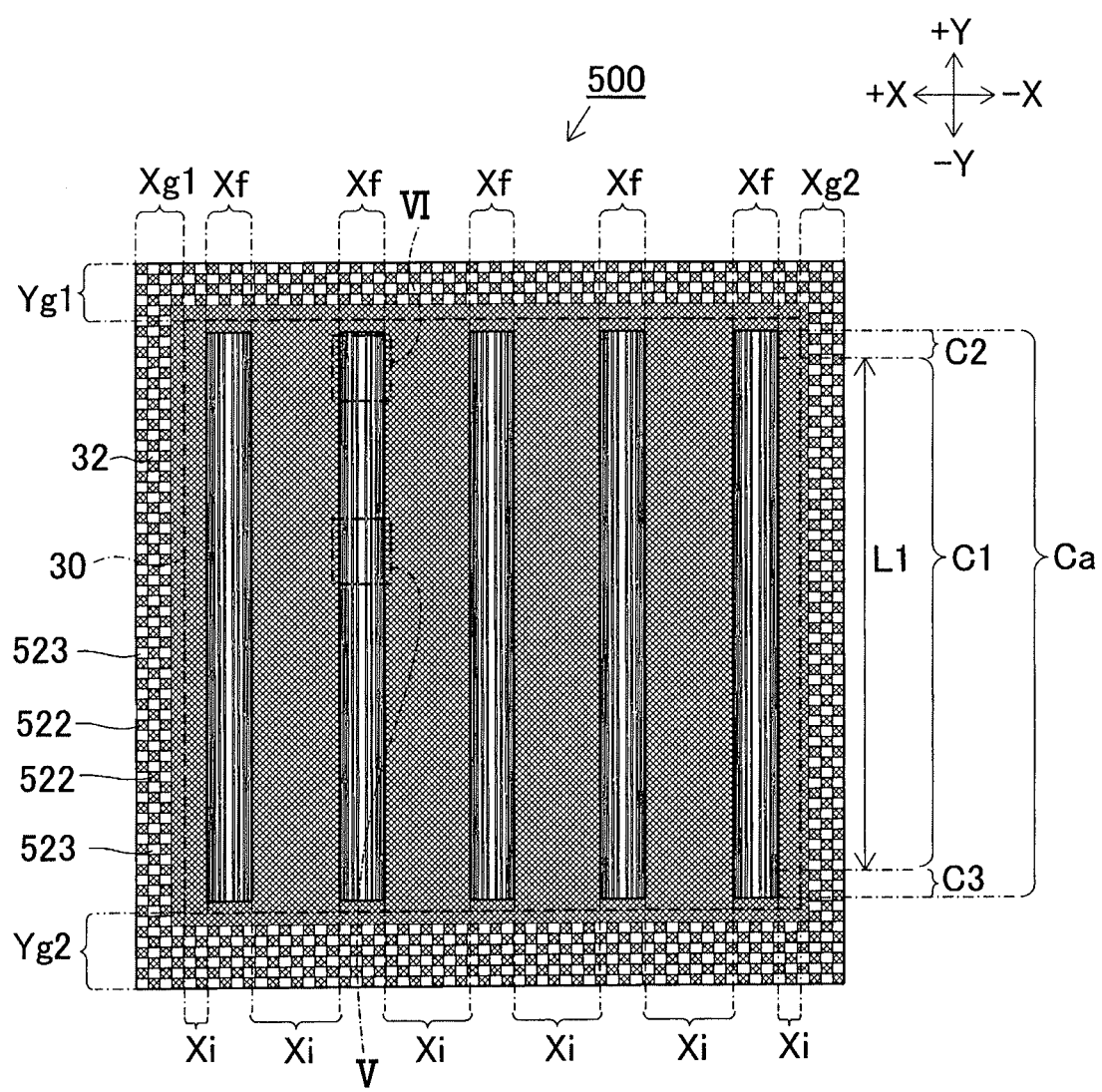
FIG. 24 is a diagram illustrating a back side view of a semiconductor device according to a fifth embodiment of the present invention.
Figure 25A:
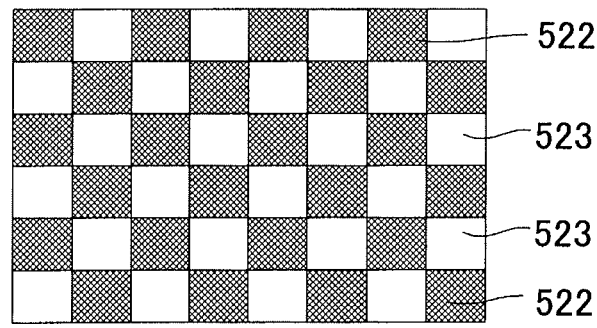
FIGS. 25A-25D are diagrams illustrating arrangement patterns of an absorption region and a second semiconductor region in an opposing region of the semiconductor device according to the fifth embodiment.
Figure 25B:
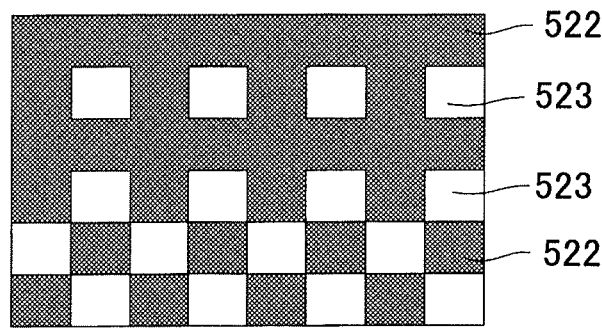
Figure 25C:
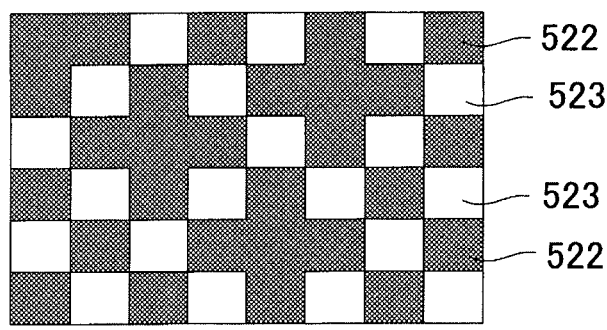
Figure 25D:
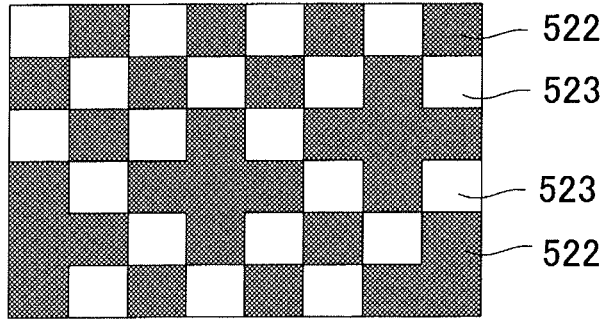

A semiconductor device 500 according to a fifth embodiment of the present invention is described below with reference to FIG. 24 and FIGS. 25A-25D. FIG. 24 is a diagram illustrating a back side view of the semiconductor device 500. FIG. 25A is a diagram illustrating a first pattern of arrangement of an absorption region 522 and an N-type semiconductor region 523 in the opposing region 32 of the semiconductor device 500. FIG. 25B is a diagram illustrating a second pattern of arrangement of the absorption region 522 and the semiconductor region 523 in the opposing region 32 of the semiconductor device 500. FIG. 25C is a diagram illustrating a third pattern of arrangement of an absorption region 522 and an N-type semiconductor region 523 in the opposing region 32 of the semiconductor device 500. FIG. 25D is a diagram illustrating a fourth pattern of arrangement of the absorption region 522 and the semiconductor region 523 in the opposing region 32 of the semiconductor device 500.

The semiconductor device 500 of the fifth embodiment is the same as the semiconductor device 1 of the first embodiment except the opposing region 32.

Referring back to FIGS. 1, 3, 4A, 4B, 5, 6, and 7A-7D, the semiconductor device 500 includes the IGBT element 100 and the FWD element 20. The IGBT element 100 and the FWD element 20 are respectively formed in the IGBT region Xi and the FWD region Xf of the element region 30 of the semiconductor substrate 101.

The semiconductor substrate 101 has the front surface and the back surface opposite to the front surface. The gate electrode 105 and the emitter electrode 107 of the IGBT element 100 are formed on the front surface side of the semiconductor substrate 101. In contrast, the collector electrode 113 of the IGBT element 100 is formed on the back surface side of the semiconductor substrate 101. The FWD elements 20 are formed adjacent to the IGBT element 100. The P-type (i.e., first conductivity type) anode region (i.e., base region 102) of the FWD element 20 is formed in the surface portion of the front surface side of the semiconductor substrate 101, and the N-type (i.e., second conductivity type) cathode region 21 of the FWD element 20 is formed in the surface portion of the back surface side of the semiconductor substrate 101. The emitter electrode 107 of the IGBT element 100 serves as the anode electrode of the FWD element 20. The collector electrode 113 of the IGBT element 100 serves as the cathode electrode of the FWD element 20.

The P-type guard ring 40 is formed in the surface portion of the front surface side of the semiconductor substrate 101. The guard ring 40 is located in the outer edge of the semiconductor substrate 101 so that the element region 30 can be surrounded by the guard ring 40. For example, the guard ring 40 can have a multiple-ring structure. The guard ring 40 has the predetermined depth from the front surface of the semiconductor substrate 101. The impurity concentration of the guard ring 40 is higher than the impurity concentration of the base region 102. Pads 91 are formed on the front surface side of the semiconductor substrate 101.

As shown in FIG. 24, a P-type (i.e., first conductivity type) absorption region 522 and an N-type semiconductor region 523 are arranged in a predetermined pattern in the opposing region 32 of the back surface side of the semiconductor substrate 101. The opposing region 32 is located in the outer edge of the back surface side of the semiconductor device 1 and faces the guard ring 40 in the thickness direction of the semiconductor device 1. The absorption region 522 prevents excessive accumulation of minority carriers (i.e., holes) in the outer edge of the semiconductor substrate 101 so that a reduction in a recovery capability can be effectively reduced. The semiconductor region 523 prevents a parasitic IGBT action so that a switching loss of the IGBT element 100 can be effectively reduced.

The absorption region 522 and the semiconductor region 523 can be arranged in the opposing region 32 in various patterns.

In a first pattern shown in FIG. 25A, the absorption region 522 and the semiconductor region 523 have the same shape and the same size. Specifically, the absorption region 522 and the semiconductor region 523 have the same square shape and are alternately arranged in a zigzag pattern. More specifically, the absorption region 522 and the semiconductor region 523 are arranged in a matrix of rows and columns. In each column, the absorption regions 522 are arranged at a regular interval, and the semiconductor regions 523 are arranged at the same interval as the absorption regions 522. Thus, in each column, the absorption region 522 and the semiconductor region 523 are alternately arranged. Likewise, in each row, the absorption regions 522 are arranged at the interval, and the semiconductor regions 523 are arranged at the same interval. Thus, in each row, the absorption region 522 and the semiconductor region 523 are alternately arranged. Therefore, the ratio of the absorption region 522 to the semiconductor region 523 is almost uniform over the opposing region 32.

As described above, in the first pattern shown in FIG. 25A, the absorption region 522 and the semiconductor region 523 are arranged in a regular pattern so that the ratio of the absorption region 522 to the semiconductor region 523 can be almost uniform over the opposing region 32. Alternatively, as shown in FIGS. 25B-25D, the absorption region 522 and the semiconductor region 523 can be arranged in an irregular pattern so that the ratio of the absorption region 522 to the semiconductor region 523 can be nonuniform over the opposing region 32. For example, in predetermined columns or rows, the semiconductor regions 523 can be arranged at an irregular interval. For another example, the semiconductor regions 523 can be arranged at a first interval in a first column or row and arranged at a second interval different from the first interval in a second column or row.

Figure 27:
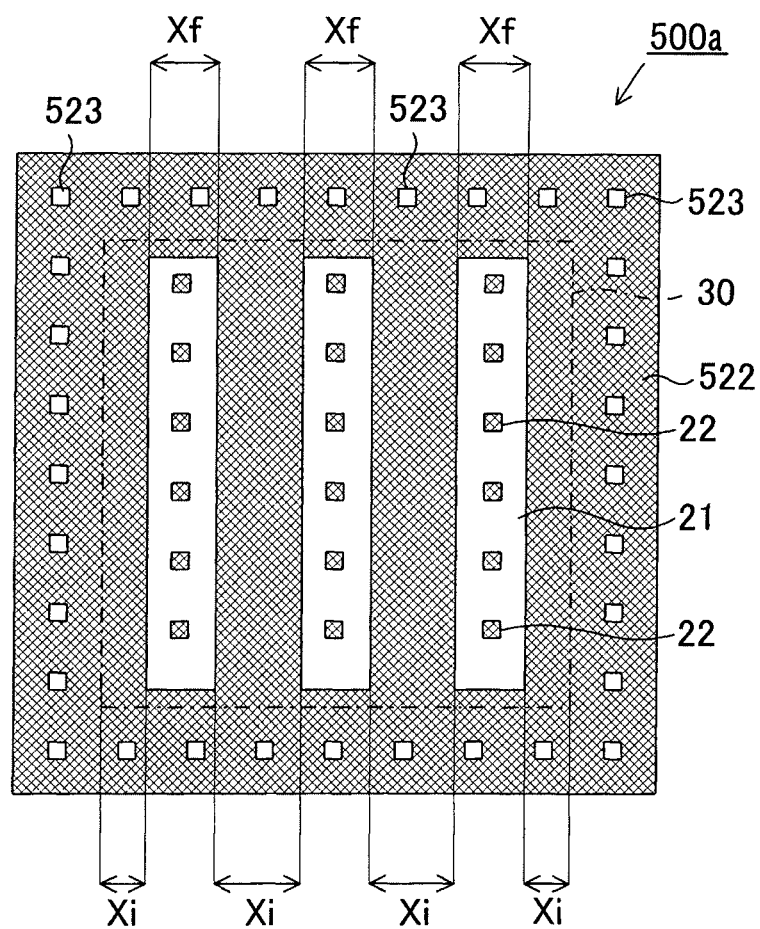
FIG. 27 is a diagram illustrating a back side view of one example of the semiconductor device according to the fifth embodiment and used in the experiment.
Figure 28:
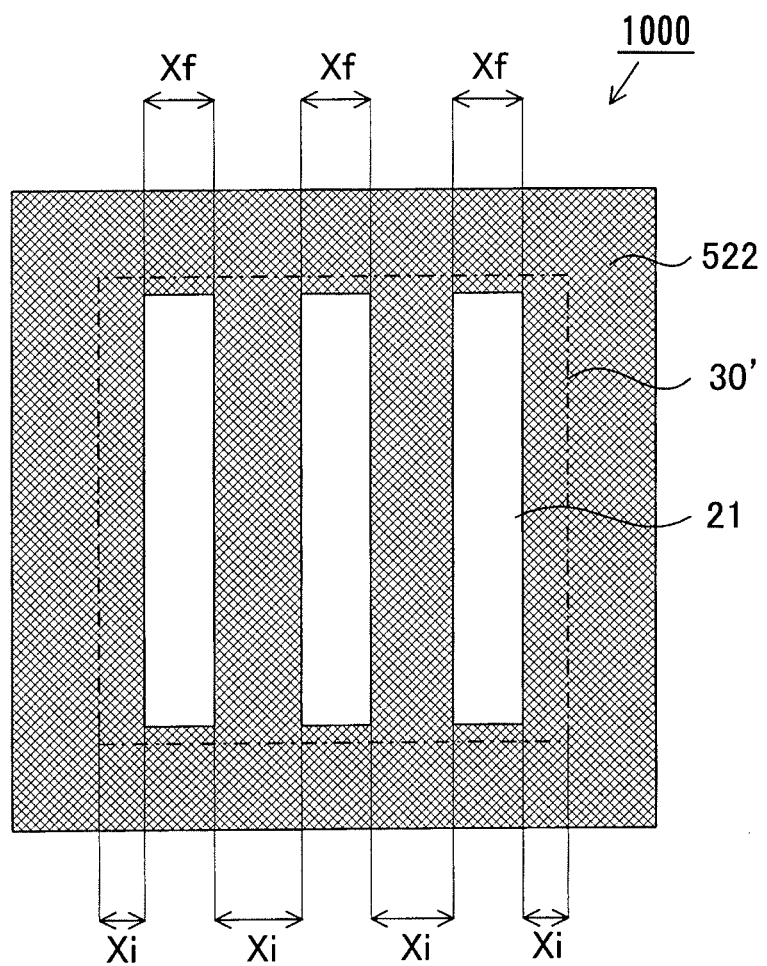
FIG. 28 is a diagram illustrating a back side view of a conventional semiconductor device used in the experiment.

The present inventors have conducted an experiment to evaluate the effect of the fifth embodiment by using a semiconductor device 500a shown in FIG. 27 and a semiconductor device 1000 shown in FIG. 28. The semiconductor device 500a is configured in the same manner as the semiconductor device 500 of the fifth embodiment. That is, in the semiconductor device 500a shown in FIG. 27, the absorption region 522 and the N-type semiconductor region 523 are arranged in a predetermined pattern in the opposing region 32 around the element region 30.

Specifically, the semiconductor region 523 has a rectangular shape with a side of about several micrometers (μm). The semiconductor regions 523 are arranged at a regular interval of 15 μm in a ring. Further, the absorption regions 22 are arranged in a predetermined pattern in the cathode region 21 in the FWD region Xf.

In contrast, in the semiconductor device 1000 shown in FIG. 28, there is no N-type semiconductor region 523 in the opposing region 32 around the element region 30. That is, in the semiconductor device 1000, the P-type absorption region 522 is formed all over the opposing region 32 around the element region 30.

Figure 26:
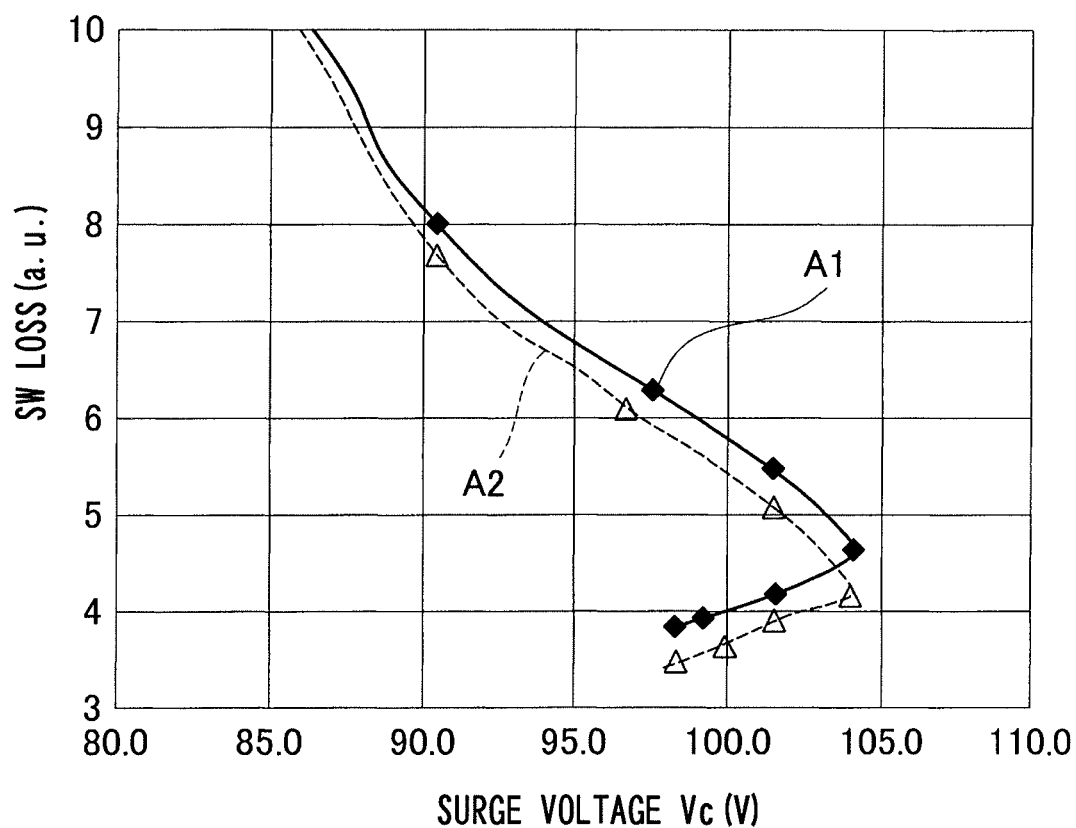
FIG. 26 is a diagram illustrating a result of an experiment conducted to evaluate an effect of the semiconductor device according to the fifth embodiment.

FIG. 26 illustrates a result of the experiment and shows a relationship between a switching loss and a surge voltage. In FIG. 26, A1 represents the semiconductor device 1000 shown in FIG. 28, and A2 represents the semiconductor device 500a shown in FIG. 27. As can be seen from FIG. 26, when the N-type semiconductor region 523 is arranged in a predetermined pattern in the opposing region 32 around the element region 30, the switching loss becomes small. A reason for this is that the semiconductor region 523 prevents a parasitic IGBT action so that the switching loss of the IGBT element 100 can be effectively reduced.

A Modification of the Sixth Embodiment

Figure 29:
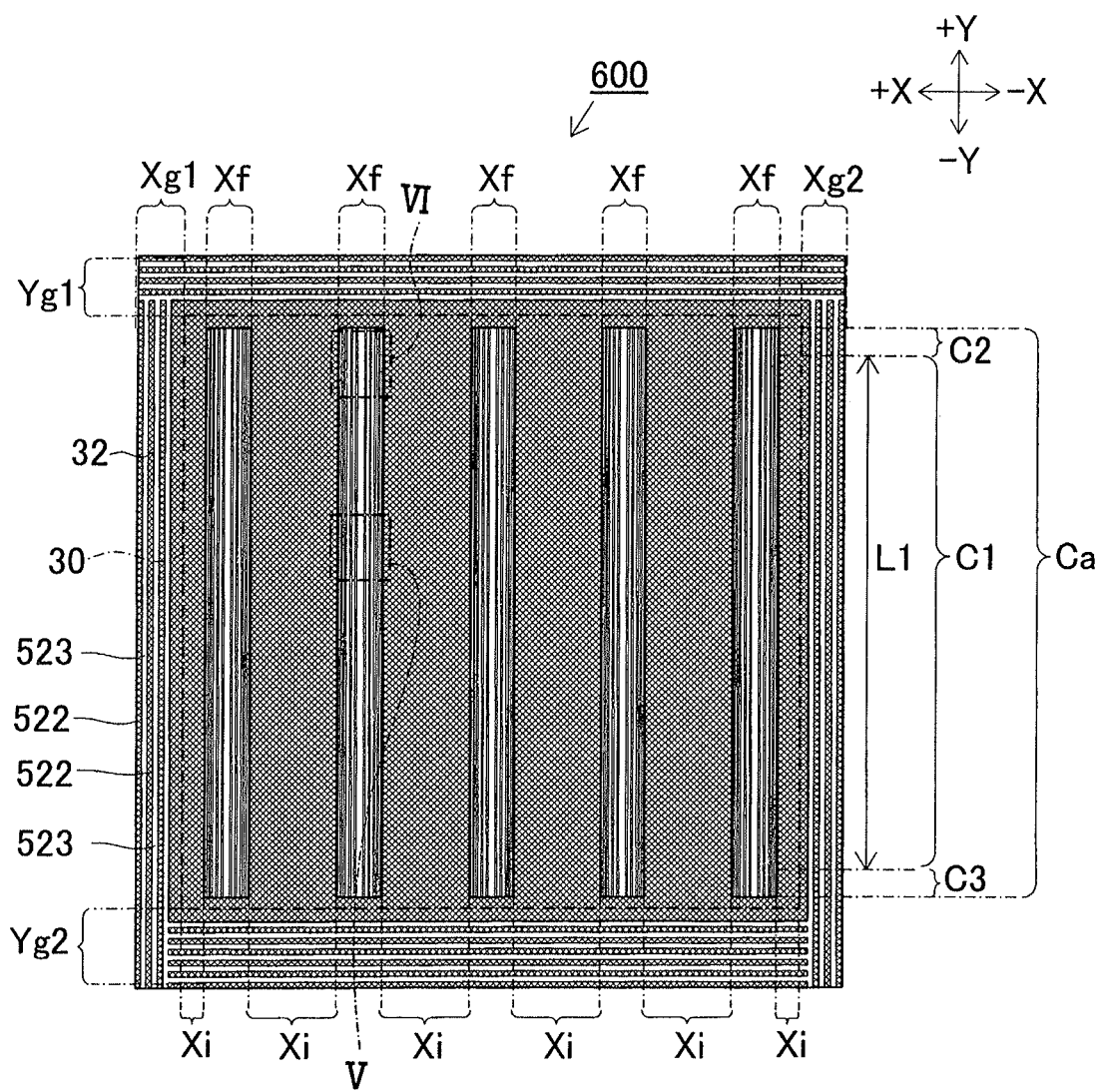
FIG. 29 is a diagram illustrating a back side view of a semiconductor device according to a modification of the fifth embodiment.
Figure 30A:
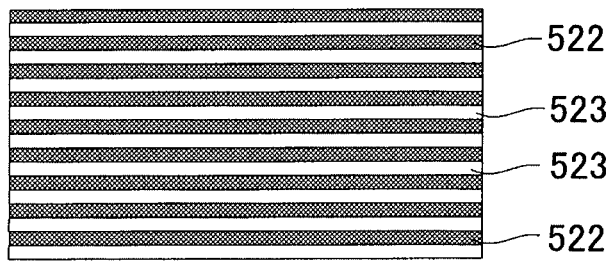
FIG. 30A-30E are diagrams illustrating arrangement patterns of an absorption region and a second semiconductor region in an opposing region of the semiconductor device according to the modification of the fifth embodiment.
Figure 30B:
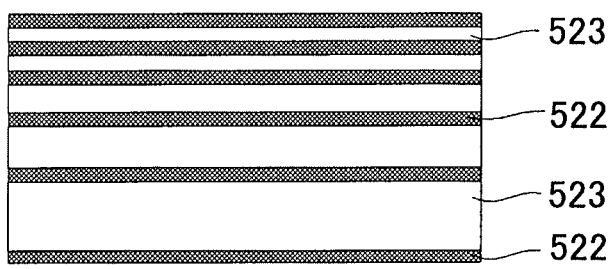
Figure 30C:
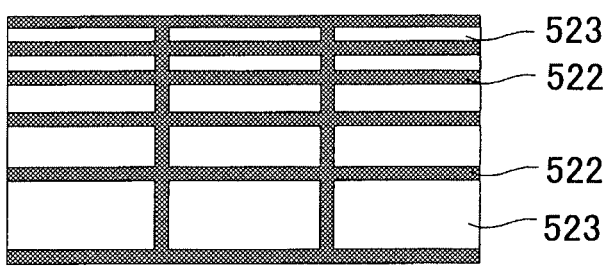
Figure 30D:
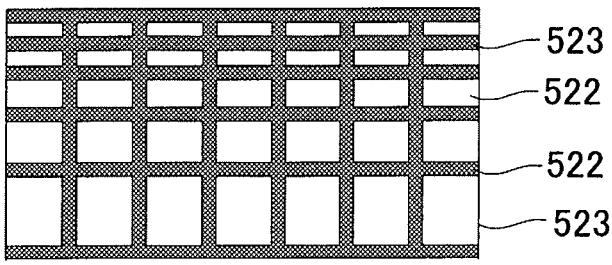

A semiconductor device 600 according to a modification of the sixth embodiment is described below with reference to FIG. 29 and FIGS. 30A-30D. FIG. 29 is a diagram illustrating a back side view of the semiconductor device 600. FIG. 30A is a diagram illustrating a first pattern of arrangement of the absorption region 522 and the N-type semiconductor region 523 in the opposing region 32 of the semiconductor device 600. FIG. 30B is a diagram illustrating a second pattern of arrangement of the absorption region 522 and the semiconductor region 523 in the opposing region 32 of the semiconductor device 600. FIG. 30C is a diagram illustrating a third pattern of arrangement of an absorption region 522 and an N-type semiconductor region 523 in the opposing region 32 of the semiconductor device 600. FIG. 30D is a diagram illustrating a fourth pattern of arrangement of the absorption region 522 and the semiconductor region 523 in the opposing region 32 of the semiconductor device 600.

The semiconductor device 600 is the same as the semiconductor device 1 of the first embodiment except the opposing region 32.

Referring back to FIGS. 1, 3, 4A, 4B, 5, 6, and 7A-7D, the semiconductor device 600 includes the IGBT element 100 and the FWD element 20. The IGBT element 100 and the FWD element 20 are respectively formed in the IGBT region Xi and the FWD region Xf of the element region 30 of the semiconductor substrate 101.

The semiconductor substrate 101 has the front surface and the back surface opposite to the front surface. The gate electrode 105 and the emitter electrode 107 of the IGBT element 100 are formed on the front surface side of the semiconductor substrate 101. In contrast, the collector electrode 113 of the IGBT element 100 is formed on the back surface side of the semiconductor substrate 101. The FWD elements 20 are formed adjacent to the IGBT element 100. The P-type (i.e., first conductivity type) anode region (i.e., base region 102) of the FWD element 20 is formed in the surface portion of the front surface side of the semiconductor substrate 101, and the N-type (i.e., second conductivity type) cathode region 21 of the FWD element 20 is formed in the surface portion of the back surface side of the semiconductor substrate 101. The emitter electrode 107 of the IGBT element 100 serves as the anode electrode of the FWD element 20. The collector electrode 113 of the IGBT element 100 serves as the cathode electrode of the FWD element 20.

The P-type guard ring 40 is formed in the surface portion of the front surface side of the semiconductor substrate 101. The guard ring 40 is located in the outer edge of the semiconductor substrate 101 so that the element region 30 can be surrounded by the guard ring 40. For example, the guard ring 40 can have a multiple-ring structure. The guard ring 40 has the predetermined depth from the front surface of the semiconductor substrate 101. The impurity concentration of the guard ring 40 is higher than the impurity concentration of the base region 102. Pads 91 are formed on the front surface side of the semiconductor substrate 101.

As shown in FIG. 29, the P-type (i.e., first conductivity type) absorption region 522 and the N-type semiconductor region 523 are arranged in a predetermined pattern in the opposing region 32 of the back surface side of the semiconductor substrate 101. The opposing region 32 is located in the outer edge of the back surface side of the semiconductor substrate 101 and faces the guard ring 40 in the thickness direction of the semiconductor device 1. The absorption region 522 prevents excessive accumulation of minority carriers (i.e., holes) in the outer edge of the semiconductor substrate 101 so that a reduction in a recovery capability can be effectively reduced. The semiconductor region 523 prevents a parasitic IGBT action so that a switching loss of the IGBT element 100 can be effectively reduced.

The absorption region 522 and the semiconductor region 523 can be arranged in the opposing region 32 in various patterns.

In a first pattern shown in FIG. 30A, the absorption region 522 and the semiconductor region 523 have almost the same shape and almost the same size. Specifically, the absorption region 522 and the semiconductor region 523 have almost the same line or rectangular shape and are alternately arranged in a stripe pattern. Therefore, the ratio of the absorption region 522 to the semiconductor region 523 is almost uniform over the opposing region 32.

As described above, in the first pattern shown in FIG. 30A, the absorption region 522 and the semiconductor region 523 are arranged in a regular pattern so that the ratio of the absorption region 522 to the semiconductor region 523 can be almost uniform over the opposing region 32. Alternatively, as shown in FIGS. 30B-30D, the absorption region 522 and the semiconductor region 523 can be arranged in an irregular pattern so that the ratio of the absorption region 522 to the semiconductor region 523 can be nonuniform over the opposing region 32.

In a second pattern shown in FIG. 30B, like the first pattern shown in FIG. 30A, the absorption region 522 and the semiconductor region 523 have a rectangular shape and are alternately arranged in a stripe pattern. However, although the absorption region 522 has a regular width, the semiconductor region 523 has an irregular width. In a third pattern shown in FIG. 30C, the absorption region 522 and the semiconductor region 523 are arranged in a large grid pattern. In a fourth pattern shown in FIG. 30D, the absorption region 522 and the semiconductor region 523 are arranged in a small grid pattern. In the second to fourth patterns, the width of the semiconductor region 523 can be larger on the far side from the element region 30 than on the near side from the element region 30. In such an approach, the ratio of the absorption region 522 to the semiconductor region 523 becomes larger on the near side from the element region 30 than on the far side from the element region 30.

Figure 30E:
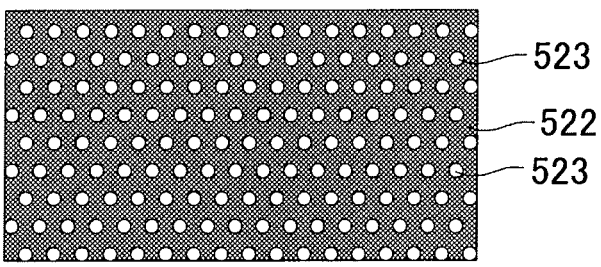

In a fifth pattern shown in FIG. 30E, the absorption region 522 and the semiconductor region 523 are arranged in a regular pattern so that the ratio of the absorption region 522 to the semiconductor region 523 can be almost uniform over the opposing region 32. Specifically, the semiconductor region 523 has a circular shape and arranged in a zigzag pattern.

Modifications

The above embodiments can be further modified in various ways, for example, as follows.

In the embodiments, the semiconductor substrate is a silicon (Si) substrate. The semiconductor substrate is not limited to a silicon substrate. For example, the semiconductor substrate can be a compound semiconductor substrate such as a silicon carbide (SiC) substrate or a gallium nitride (GaN) substrate.

In the first embodiment, the IGBT element 100 is a reverse conducting (RC) IGBT. The IGBT element 100 is not limited to a RC-IGBT. For example, the IGBT element 100 can be a planar gate IGBT.

The trench structure of the IGBT element 100 is not limited to the embodiments. For example, the IGBT element 100 can have a conventional trench structure as disclosed in, for example, JP-A-2007-258363. For another example, the base region 102 can have only the second base region 102b without the first base region 102a.

In the second embodiment, the ratio Wn/Lh, representing the ratio of the cathode region width Wn to the minority carrier diffusion length Lh, ranges from 0.5 to 1.5 (preferably, 0.5 to 1.0). Likewise, in the other embodiments, the ratio Wn/Lh can range from 0.5 to 1.5 (preferably, 0.5 to 1.0).

Such changes and modifications are to be understood as being within the scope of the present invention as defined by the appended claims.

What is claimed is:

1. A semiconductor device comprising:
a semiconductor substrate with a first surface and a second surface, the semiconductor substrate having an element region including an IGBT region and a diode region located adjacent to the IGBT region;
an IGBT element formed in the IGBT region, the IGBT element having an emitter electrode on the first surface side, a gate electrode on the first surface side, and a collector electrode on the second surface side;
a diode element formed in the diode region, the diode element having a first semiconductor region of first conductivity type on one of the first surface side and the second surface side and a second semiconductor region of second conductivity type on the other of the first surface side and the second surface side;
a heavily doped region of first conductivity type located on the first surface side around the element region;
an absorption region of first conductivity type located on the second surface side around the element region; and
a third semiconductor region of second conductivity type located on the second surface side around the element region, wherein
the third semiconductor region is arranged in an irregular pattern.

2. A semiconductor device comprising:
a semiconductor substrate with a first surface and a second surface, the semiconductor substrate having an element region including an IGBT region and a diode region located adjacent to the IGBT region;
an IGBT element formed in the IGBT region, the IGBT element having an emitter electrode on the first surface side, a gate electrode on the first surface side, and a collector electrode on the second surface side;
a diode element formed in the diode region, the diode element having a first semiconductor region of first conductivity type on the first surface side and a second semiconductor region of second conductivity type on the second surface side; and
an absorption region of first conductivity type located on the second surface side in the diode region, wherein
a first ratio of the absorption region to the second semiconductor region on the second surface side in the diode region is greater in a first portion than in a second portion, and
the first portion is located closer to the IGBT region than the second portion.

3. The semiconductor device according to claim 2, further comprising:
a guard ring of first conductivity type located on the first surface side around the element region, wherein
a second ratio of the absorption region to the second semiconductor region on the second surface side in the diode region is greater in a third portion than in a fourth portion,
the third portion faces the guard ring in a direction from the first surface to the second surface of the semiconductor substrate, and
the third portion is located closer to the guard ring than the fourth portion.

4. The semiconductor device according to claim 2, further comprising:
a guard ring of first conductivity type located on the first surface side around the element region; and
a third semiconductor region of second conductivity type located on the second surface side around the element region.

5. A semiconductor device comprising:
a semiconductor substrate having a first surface and a second surface opposite to the first surface;
a first semiconductor region located on the first surface side of the semiconductor substrate;
a second semiconductor region of second conductivity type located on the first surface side of the semiconductor substrate;
a first electrode connected to the first semiconductor region;
a second electrode connected to the second semiconductor region;
a guard ring of first conductivity type located around the first semiconductor region on the first surface side; and
an absorption region of first conductivity type located adjacent to the second semiconductor region on the second surface side, wherein a ratio of the absorption region to the second semiconductor region on the second surface side is greater in a first portion than in a second portion, the first portion faces the guard ring in a direction from the first surface to the second surface of the semiconductor substrate, and the first portion is located closer to the guard ring than the second portion.

6. The semiconductor device according to claim 5, wherein the first semiconductor region is an anode region of first conductivity type, the second semiconductor region is a cathode region, and the second portion faces the anode region in the direction.

7. The semiconductor device according to claim 5, wherein the first semiconductor region is a source region of second conductivity type, the second semiconductor region is a drain region, and the source region and the drain region form a MOS transistor.

* * * * *